(12) United States Patent
Corr

(10) Patent No.: US 7,072,812 B2
(45) Date of Patent: Jul. 4, 2006

(54) INTERPOLATION ERROR MINIMIZATION FOR DATA REDUCTION

(75) Inventor: William E. Corr, Twickenham (GB)

(73) Assignee: Micron Technology, Inc., Boise, ID (US)

( * ) Notice: Subject to any disclaimer, the term of this patent is extended or adjusted under 35 U.S.C. 154(b) by 493 days.

(21) Appl. No.: 10/213,214

(22) Filed: Aug. 6, 2002

(65) Prior Publication Data

US 2003/0025712 A1 Feb. 6, 2003

Related U.S. Application Data

(63) Continuation of application No. PCT/US01/24566, filed on Aug. 6, 2001.

(51) Int. Cl.
*G06F 17/10* (2006.01)

(52) U.S. Cl. ............................... 703/2; 708/203
(58) Field of Classification Search .................. 703/2
See application file for complete search history.

(56) References Cited

U.S. PATENT DOCUMENTS

| | | | |
|---|---|---|---|
| 4,251,814 A | 2/1981 | Dagostino | 345/440.1 |
| 4,962,662 A | 10/1990 | Berger | 73/23.42 |
| 5,297,066 A | 3/1994 | Mayes | 708/14 |
| 5,373,457 A * | 12/1994 | George et al. | 703/2 |
| 5,449,732 A | 9/1995 | Smith et al. | 526/348.3 |
| 5,675,253 A | 10/1997 | Smith et al. | 324/306 |
| 5,740,089 A | 4/1998 | Menkhoff et al. | 708/290 |
| 5,774,382 A * | 6/1998 | Tyler et al. | 703/2 |
| 5,961,454 A | 10/1999 | Kooy et al. | 600/407 |
| 6,120,460 A | 9/2000 | Abreu | 600/558 |
| 6,499,129 B1 * | 12/2002 | Srinivasan et al. | 716/4 |
| 6,505,060 B1 | 1/2003 | Norris | 600/323 |
| 2002/0152248 A1 | 10/2002 | Bentz | 708/290 |
| 2003/0016879 A1 | 1/2003 | Slavin | 382/261 |
| 2003/0101026 A1 | 5/2003 | Rabinowitz et al. | 702/189 |
| 2003/0149703 A1 | 8/2003 | Hunt et al. | 707/102 |

FOREIGN PATENT DOCUMENTS

EP 0851684 12/1996

(Continued)

OTHER PUBLICATIONS

Pavlidis, Theodosios; Waveform Segmentation Through Functional Approximation, Jul. 1973, IEEE Transactions on Computers, vol. C-22, pp. 689-697.*

(Continued)

*Primary Examiner*—Paul L. Rodriguez
*Assistant Examiner*—Russ Guill
(74) *Attorney, Agent, or Firm*—Schwegman, Lundberg, Woessner & Kluth, P.A.

(57) ABSTRACT

Systems and methods are provided for reducing a set of data points into a subset of best fit data points. According to one aspect, a method of adjusting a series of N data points into best fit data points for a set of sample data points that form a data source is provided. According to this method, M segments are identified, wherein M equals N−1. Each segment has endpoints defined by adjacent subset data points. An iterative process is performed that includes determining a linear interpolation error for each of the M segments, selecting a target segment ($S_{TARGET}$) from the segments, and reducing the interpolation error for $S_{TARGET}$ by moving one endpoint of $S_{TARGET}$ by an increment corresponding to at least one sample data point in the series of sample data points to shorten $S_{TARGET}$. Other methods and systems are provided herein.

104 Claims, 20 Drawing Sheets

FOREIGN PATENT DOCUMENTS

FR        2728987      7/1996
WO     WO-94/03853   2/1994

OTHER PUBLICATIONS

Pavlidis, Theodosios; The Use of Algorithms of Piecewise Approximations for Picture Processing Applications, Dec. 1976, ACM Transactions on Mathematical Software, vol. 2, No. 4.*

Hannauer, George , "Curve-fitting techniques in function generation", *Proc. of the IMACS (AICA) International Symposium on Simulation Software & Numerical Methods for Differential Equations, XP*008001842, (Mar. 9, 1977), 103-110.

De Boor, Carl , et al., "Least Squares Cubic Spline Approximation II- Variable Knots", Department of Computer Sciences Purdue University, CSD TR 21,(Apr. 1968),1-43.

* cited by examiner

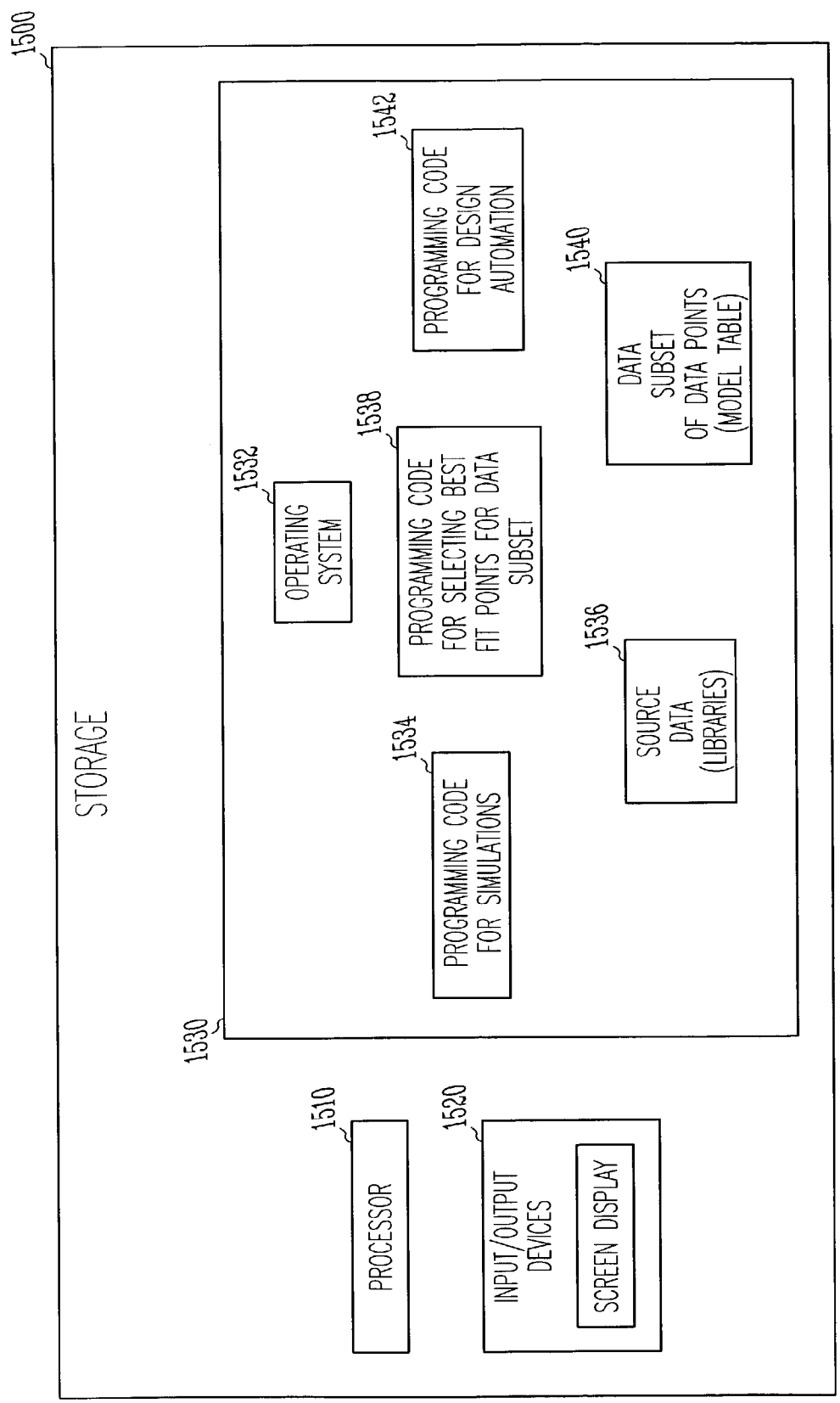

INTERPOLATION ERROR MINIMIZATION FOR DATA REDUCTION

RELATED APPLICATIONS

This application is a continuation under 35 U.S.C. 111(a) from International Application No. PCT/US01/24566 filed on Aug. 6, 2001 which is incorporated herein by reference.

TECHNICAL FIELD OF THE INVENTION

This invention relates generally to methods and systems for selecting best fit data points for a subset of a data source to reduce the linear interpolation error between the data subset and the data source; and more particularly, to methods and systems for reducing cell characterization data into a simulation model table by selecting best fit data points to reduce linear interpolation error.

BACKGROUND OF THE INVENTION

Computer simulations that provide mathematical models of a circuit design are typically used in electronics design automation. The circuit model allows a designer to verify or manipulate the design parameters to identify and solve design problems before proceeding with the cost and effort of building a physical embodiment.

A simulation generates source data that is characteristic of electronic components. This source data is digitally stored as a plurality of data sample points. The simulation may define a pre-defined library of modules for transistor level characteristics, such as timing and propagation delay. A large number of transistors and other electrical components for a simulated circuit may be grouped into function blocks known as cells. These function cell blocks allow the designer to work at a higher level than at the transistor level.

In one design automation example, the designer uses design automation software tools to interconnect the terminals of devices or sub-circuits selected from a device library as required to form a circuit design schematic. The device library contains digital data for producing representations of common devices, and further contains cell characterization data for sub-circuits or function cell blocks. A device or sub-circuit selection from the device library allows a representation of the selected device or sub-circuit to be displayed on the screen of a display unit.

Typically, in order for the design automation software tools to use the cell characterization data source from the simulation, the data sources are reduced or compressed into smaller data subsets that require less storage and less processing bandwidth. These data subsets are used in model tables for the device library. The design tools perform a simulation of the newly created circuit design by interpolating the subset data points to recreate an approximation to the cell characterization data source. Poorly chosen subset data points can cause an unacceptably large interpolation error that detrimentally effects the accuracy of the simulation. The error attributable to poorly chosen data points tends to be aggravated when the number of data points in the data subset is relatively small.

The following example illustrates a conventional method for characterizing a cell with a data subset. The switching speed of a cell is dependent on the number of cells driven by that cell. Therefore, the cell is characterized by simulating the cell as it drives many different loads. Conventionally, a standard load is equivalent to the input of one cell. The resulting data is collected and used in a simulation model for the cell. These models are able to be used, for example, in higher level simulations that evaluate the performance of all the cells in a chip to ensure that the chip is able to operate at the desired speed.

In further development of this example, a buffer cell is characterized with a number of loads on its output. An output load of "1" is the minimum load possible and, for this example, an output load of "32" is the maximum load allowable before the output is slowed down to a point at which it breaks the maximum ramp time rule set for the library in question. Therefore, the bounds of the characterization simulation are 1 load and 32 loads. Conventionally, the points in between these bounds is determined using engineering judgment and educated guesses. Conventionally, for a target model table size of 6 loads, a geometrically increasing series of 1, 2, 4, 8, 16 and 32 may be chosen because the rate of change of delay is greater for small loads. As such, the buffer circuit in this example is characterized with 1, 2, 4, 8, 16, and 32 loads on its output. The geometrically increasing series provides more data points for smaller loads and fewer data points for larger loads. However, this geometrically increasing series still may contain unacceptably large interpolation errors between the six-load data subset and the data source.

Therefore, there is a need in the art to provide a method and system that overcomes these problems by reducing data into a subset in such a way as to minimize interpolation error. Particularly, there is a need for improving the accuracy of a modeled device by selecting best fit points as the characteristic sample for the data subset used in the simulation model.

SUMMARY OF THE INVENTION

The above mentioned problems are addressed by the present subject matter and will be understood by reading and studying the following specification. The present subject matter provides a method and system for reducing a set of data points to a smaller subset such that the linear interpolation of the subset data points closely approximates the original data. One application is electronics design automation. Simulations of electronics provide characteristic source data stored as a plurality of data sample points. The source data is reduced to a smaller subset for use by design automation software tools. Choosing best fit subset data points improves the accuracy of the design tools.

One aspect of the present invention is a method of adjusting a series of N data points into best fit data points for a data source. According to one embodiment of this method, M segments are identified, wherein M equals N−1. Each segment has endpoints defined by adjacent subset data points. An iterative process is performed that includes determining a linear interpolation error for each of the M segments, selecting a target segment ($S_{TARGET}$) from the segments, and reducing the interpolation error for $S_{TARGET}$.

Another aspect of the present invention is a method of reducing linear interpolation error for a data subset that contains a series of data points from a source data. According to one embodiment of this method, a target segment ($S_{TARGET}$) is identified. The $S_{TARGET}$ has endpoints defined by a first data point ($P_S$) and a second data point ($P_{S+1}$). It is determined whether there is a first adjacent segment ($S_{1ST}$) having a common endpoint with $S_{TARGET}$ such that $S_{1ST}$ has endpoints defined by a first data point ($P_{S-1}$) and a second data point ($P_S$). It is also determined whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$) Upon determining that there is no $S_{1ST}$, the point $P_{S+1}$ is moved to shorten $S_{TARGET}$ and lengthen $S_{2ND}$. Upon determining that there is no $S_{2ND}$, the point $P_S$ is moved to shorten $S_{TARGET}$ and lengthen $S_{1ST}$. Upon determining that there is a $S_{1ST}$ and a $S_{2ND}$, it is determined whether an interpolation error for $S_{1ST}$ ($ES_{1ST}$) or an interpolation error for $S_{2ND}$ ($ES_{2ND}$) is larger. Upon determining that $ES_{1ST}$ is larger than $ES_{2ND}$, the point $P_{S+1}$ is moved to shorten $S_{TARGET}$ and lengthen $S_{2ND}$. Upon determining that $ES_{2ND}$ is larger than $ES_{1ST}$, the point $P_S$ is moved to shorten $S_{TARGET}$ and lengthen $S_{1ST}$.

Another aspect of the present invention is a method of selecting best fit data points for source data. According to one embodiment of this method, a series of N data points are seeded on the source data. An iterative process is performed, in which the linear interpolation errors between the N data points and the source data for M segments is determined. The M segments are sorted based on linear interpolation error size. A target segment ($S_{TARGET}$) is identified from the M segments, and the linear interpolation error for $S_{TARGET}$ is reduced.

Another aspect of the present invention is a method of reducing characterization data from a characterization source data into a data subset for a model table by selecting best fit data points to reduce the linear interpolation error in a simulation model. According to one embodiment of this method, a series of data points is seeded on the characterization source data. Segments are identified having endpoints defined by adjacent data points. A linear interpolation error is determined for each of the segments. A target segment ($S_{TARGET}$) is selected from the segments, and the interpolation error is reduced for $S_{TARGET}$.

These and other aspects, embodiments, advantages, and features will become apparent from the following description of the invention and the referenced drawings.

BRIEF DESCRIPTION OF THE DRAWINGS

FIG. 15 is a block diagram of a system according to the present invention.

DETAILED DESCRIPTION OF THE INVENTION

Figure 1A:
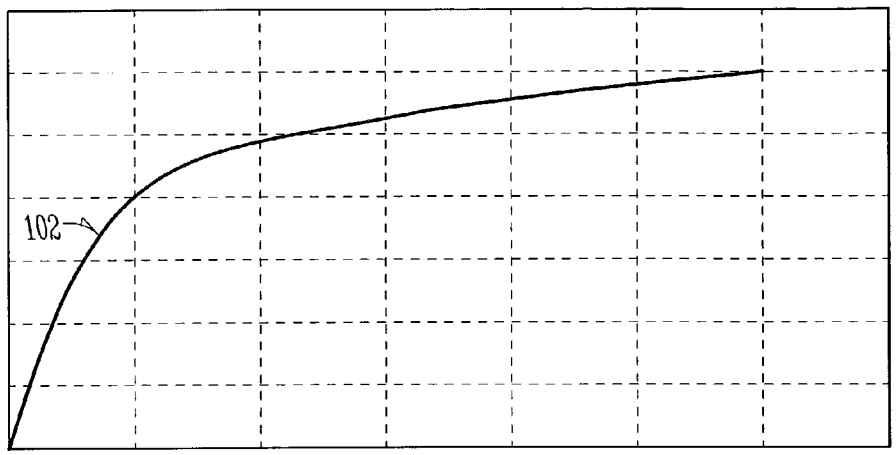
FIG. 1A is an illustration of source data.

The following detailed description of the invention refers to the accompanying drawings which show, by way of illustration, specific aspects and embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The present invention may be practiced with various coordinate systems and dimensions. The following detailed description is, therefore, not to be taken in a limiting sense, and the scope of the present invention is defined only by the appended claims, along with the full scope of equivalents to which such claims are entitled.

FIG. 1A is an illustration of source data. In one embodiment, the source data 102 is simulation data. In one embodiment, the source data is cell characterization data. However, the present invention is not limited for use with any particular type of source data. In a digital system, this source data is stored as a plurality of sample data points. The digitized source data is more accurate if it has a higher resolution; that is, if it includes more sample data points. However, certain applications and processes require or desire a smaller data set, or data subset that still is able to accurately reflect the source data. A data subset requires less storage and uses less bandwidth in comparison to the entire digitized source data. One example of an application in which a data subset is desirable is electronics design automation tools.

Figure 1B:
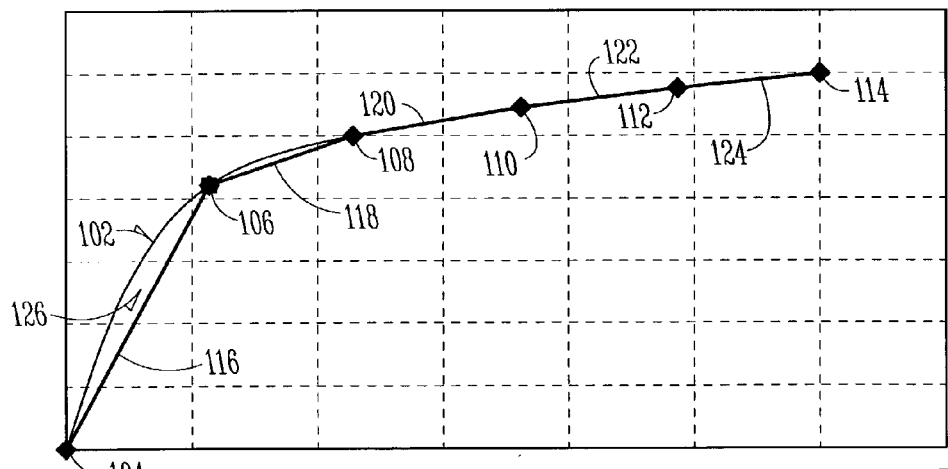
FIG. 1B is an illustration of a subset of data points on the source data, and the resulting linear interpolation error.

FIG. 1B is an illustration of a subset of data points on the source data, and the resulting linear interpolation error. In this illustration, the data points 104, 106, 108, 110, 112 and 114 are spaced equally across the range of the data source. A linear interpolation process is performed on the subset to recreate an approximation to the original data source 102. The subset data points are interpolated such that a line or, segment is formed between adjacent data points. Segment 116 has endpoints defined by data points 104 and 106; segment 118 has endpoints defined by data points 106 and 108; segment 120 has endpoints defined by data points 108 and 110; segment 122 has endpoints defined by data points 110 and 112; and segment 124 has endpoints defined by data points 112 and 114. As seen in FIG. 1B, segments 120, 122 and 124 closely approximate the data source 102, but segments 116 and 118 do not. The area between the original data source 102 and the segments, such as the area represented at 126, is known as linear interpolation error. Significant linear interpolation errors 126 detrimentally affect the accuracy of applications or processes that use the data subset. For example, as illustrated in FIG. 1B, an interpolation of the data subset represented by points 104, 106, 108, 110, 112 and 114 suffers significant error between data points 104 and 106.

Figure 1C:
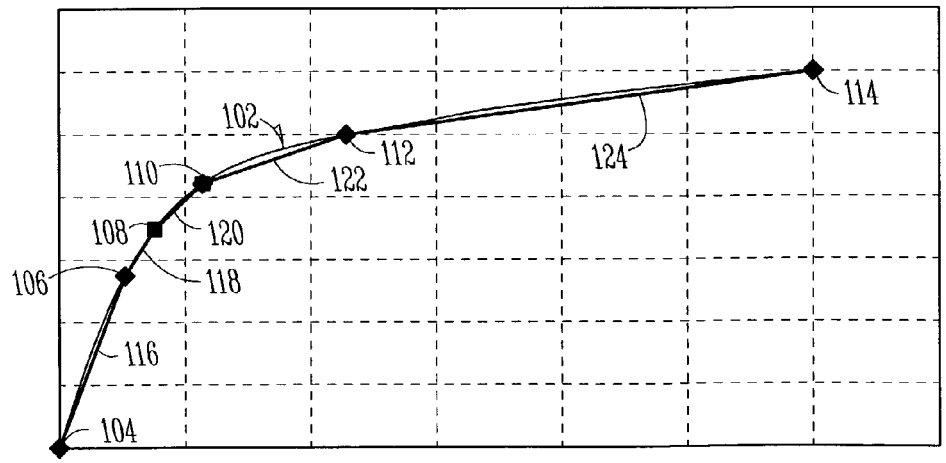
FIG. 1C is an illustration of a subset of best fit data points on the source data, and the corresponding reduction of the linear interpolation error in comparison to the error shown in FIG. 1B.

FIG. 1C is an illustration of a subset of best fit data points on the data source, and the corresponding reduction of the linear interpolation error in comparison to the error shown in FIG. 1B. Rather than being equally spaced as was illustrated in FIG. 1B, the subset data points 104, 106, 108, 110, 112 and 114 are grouped more closely around the curvilinear region of the data source and further apart around the more linear regions. The interpolation of these subset data points, as arranged in FIG. 1C, closely represents the original source data 102. For a given number of subset data points, an interpolation process will more closely approximate the original source data 102 if the subset data points are carefully selected. The linear segments 118, 120 and 122 are shorter around the more curvilinear region of the data source 102, and the linear segments 116 and 124 are longer around the more linear regions of the data source 102. The shorter segments in the curvilinear sections reduce interpolation error. The data points represented in FIG. 1C are best fit data points. Best fit data points are those points chosen to minimize linear interpolation error.

Figure 2A:
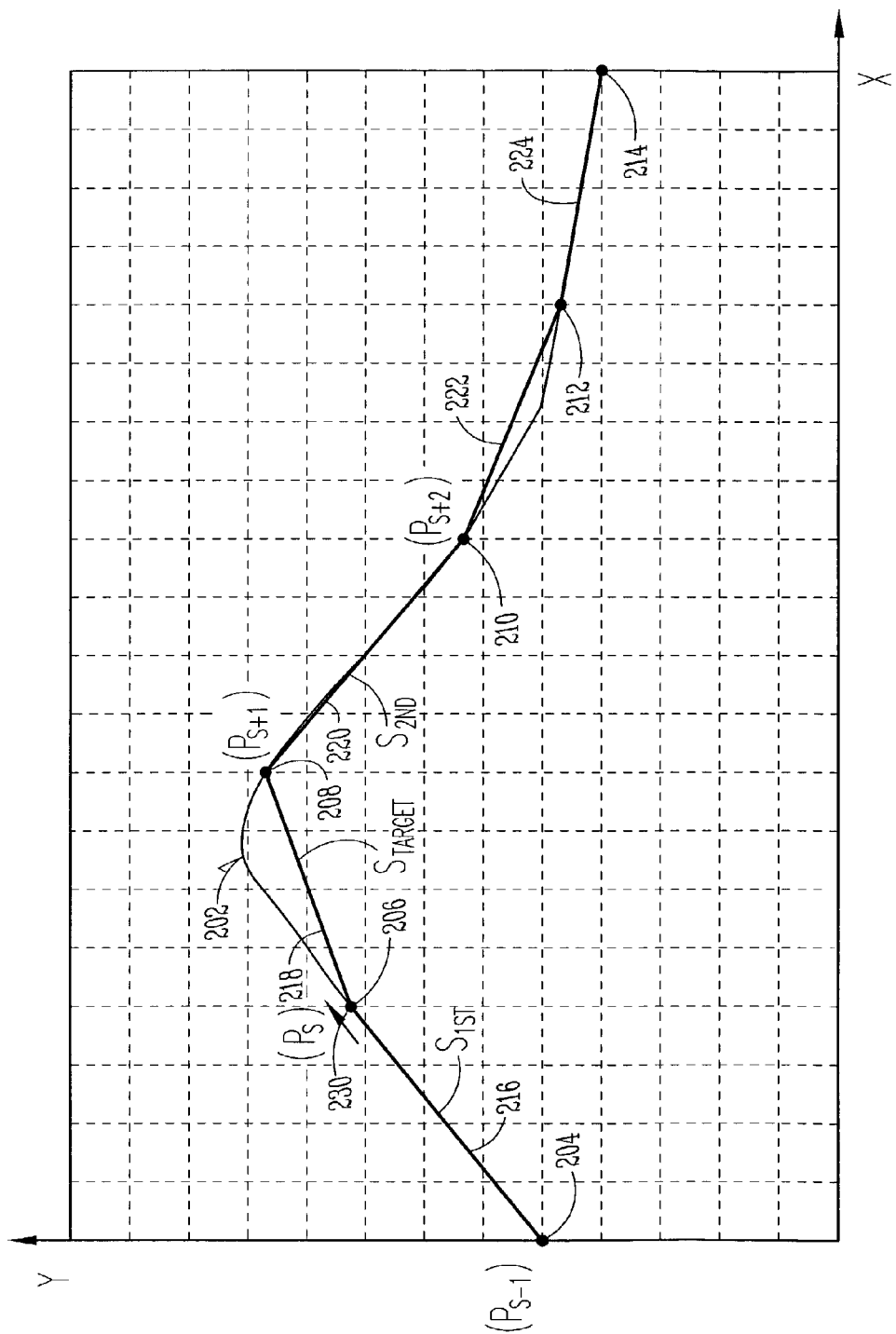
FIG. 2A–2H illustrate a method for adjusting a subset of data points to provide best fit data points for minimizing the linear interpolation error.

FIG. 2A–2H illustrate a method for adjusting a subset of data points to provide best fit data points for minimizing the linear interpolation error. This method is an iterative method. FIG. 2A provides a curve that illustrates original data source 202, and further illustrates a data subset of data points 204, 206, 208, 210, 212 and 214. It is noted that the illustrated curve is not intended to portray a particular shape that one would expect to see in a cell characterization. Rather this curve is provided to illustrate a method for adjusting a subset of data point to provide best fit data points for minimizing the linear interpolation error.

In this illustration, the subset is represented by six subset data points. According to one embodiment, the source data is cell characterization data, and the data subset is incorporated into a model table for simulations. These six data points are initially seeded on the data source 202. According to one embodiment, the subset data points are seeded by being equally spaced along the X-axis range of the data source. These subset data points can be considered to be a series of data points extending from one end of the source data range to the other. In the illustrated example, the data point 204 can be considered to be the first data point in the series, and data point 214 can be considered to be the last data point in the series.

Interpolation of these six data points forms five segments. Each segment has endpoints defined by two adjacent subset data points. Segment 216 has endpoints defined by data points 204 and 206, segment 218 has endpoints formed by data points 206 and 208, segment 220 is formed by data points 208 and 210, segment 222 is formed by data points 210 and 212, and segment 224 is formed by data points 212 and 214. The segment with the largest interpolation error is set as the target segment ($S_{TARGET}$). Methods for determining interpolation error will be described below. In the mean time, for the illustration shown in FIGS. 2A–2H, a judgment as to which segment has the largest interpolation error will be determined visually.

In FIG. 2A, the segment with the largest interpolation error is segment 218. Given the fact that $S_{TARGET}$ is 218, the first endpoint of $S_{TARGET}$ is data point 206 which can be labeled $P_S$, and the second endpoint of $S_{TARGET}$ is data point 208, which can be labeled $P_{S+1}$ as it is the next sequential data point in the data subset. Additionally, data point 204 can be labeled $P_{S-1}$ as it is the previous data point in the series before point P, and data point 210 can be labeled $P_{S+2}$ as it is the next data point in the series after point $P_{S+1}$.

The interpolation error for the segments adjacent to $S_{TARGET}$ are compared. A first adjacent segment is segment 216, which has endpoints defined by $P_{S-1}$ and $P_S$ and can be labeled $S_{1st}$. A second adjacent segment is segment 220, which has endpoints defined by $P_{S+1}$ and $P_{S+2}$ and can be labeled $S_{2nd}$.

Figure 2B:
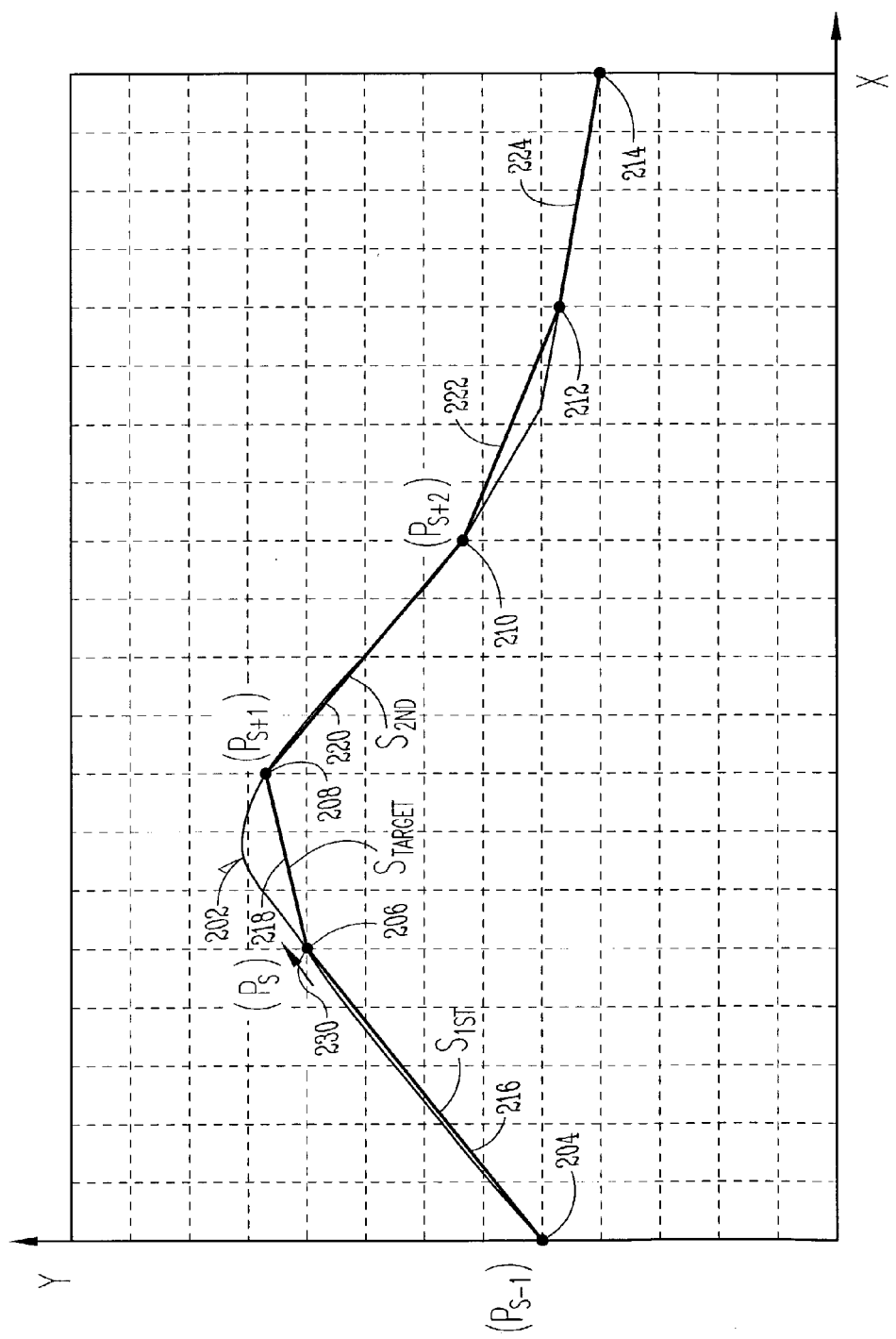

An iterative process is performed to reduce the interpolation error. The goal is to shorten $S_{TARGET}$, and thus reduce the error associated with it, by lengthening the adjacent segment with the smaller interpolation error. In FIG. 2A, $S_{1st}$ has a smaller interpolation error than $S_{2nd}$. Therefore, data point $P_S$ is the chosen point 230 to be moved to shorten $S_{TARGET}$ and lengthen $S_{1st}$ as illustrated by the direction of the arrow. The subset of data points 204, 206, 208, 210, 212 and 214 are now positioned as illustrated in FIG. 2B. The movement of the chosen point 230 is an incremental or discrete movement. In the illustrated example shown in FIGS. 2A–2H, the chosen point 230 is capable of being moved on the incremental values of X, as illustrated by the vertical grid lines. According to one embodiment, the incremental motion has an increment of one or more sample points in the data source 202. In another embodiment, the incremental motion is based on some other criteria such that a data source value is estimated between the data source sample points. According to one embodiment, the incremental motion is user-defined or otherwise programmable.

Referring to FIG. 2B, the interpolation error is once again determined for each of the five segments 216, 218, 220, 222 and 224 defined by the six subset data points 204, 206, 208, 210, 212 and 214 in the subset. In this embodiment, segment 218 still has the largest interpolation error, and thus is classified as $S_{TARGET}$. As a result, data point 206 is labeled $P_S$, data point 208 is labeled $P_{S+1}$, data point 210 is labeled $P_{S+2}$ and data point 204 is labeled $P_{S-1}$. Additionally, segment 216, which has endpoints defined by $P_{S-1}$ and $P_S$, is labeled $S_{1st}$, and segment 220, which has endpoints defined by $P_{S+1}$ and $P_{S+2}$, is labeled $S_{2nd}$. In FIG. 2B, $S_{1st}$ has a smaller interpolation error than $S_{2nd}$. Therefore, data point $P_S$ is the chosen point 230 to be moved to shorten $S_{TARGET}$ and lengthen $S_{1st}$ as illustrated by the direction of the arrow. The subset of data points 204, 206, 208, 210, 212 and 214 are now positioned as illustrated in FIG. 2C.

Figure 2C:
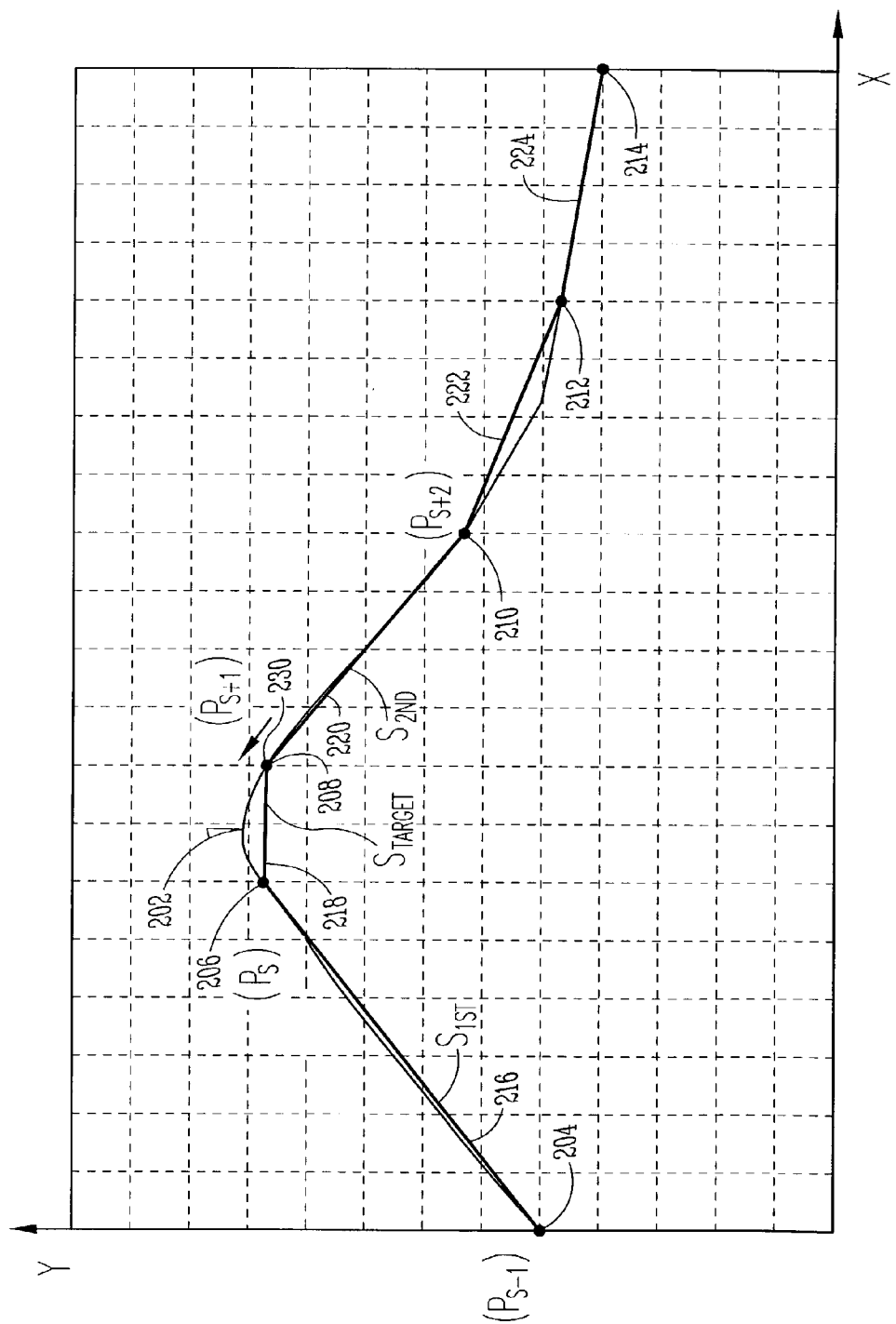

Referring to FIG. 2C, the interpolation error once again is determined for each of the five segments 216, 218, 220, 222 and 224 defined by the six subset data points 204, 206, 208, 210, 212 and 214 in the subset. Segment 218 still has the largest interpolation error, and thus is classified as $S_{TARGET}$ again. As a result, data point 206 is labeled $P_S$, data point 208 is labeled $P_{S+1}$, data point 210 is labeled $P_{S+2}$ and data point 204 is labeled $P_{S-1}$. Additionally, segment 216, which has endpoints defined by $P_{S-1}$ and $P_S$, is labeled $S_{1st}$, and segment 220, which has endpoints defined by $P_{S+1}$ and $P_{S+2}$, is labeled $S_{2nd}$. In FIG. 2C, $S_{2nd}$ has a smaller interpolation error than $S_{1st}$. Therefore, data point $P_{S+1}$ is the chosen point 230 to be moved to shorten $S_{TARGET}$ and lengthen $S_{2nd}$ as illustrated by the direction of the arrow. The subset of data points 204, 206, 208, 2 10, 212 and 214 are now positioned as illustrated in FIG. 2D.

Figure 2D:
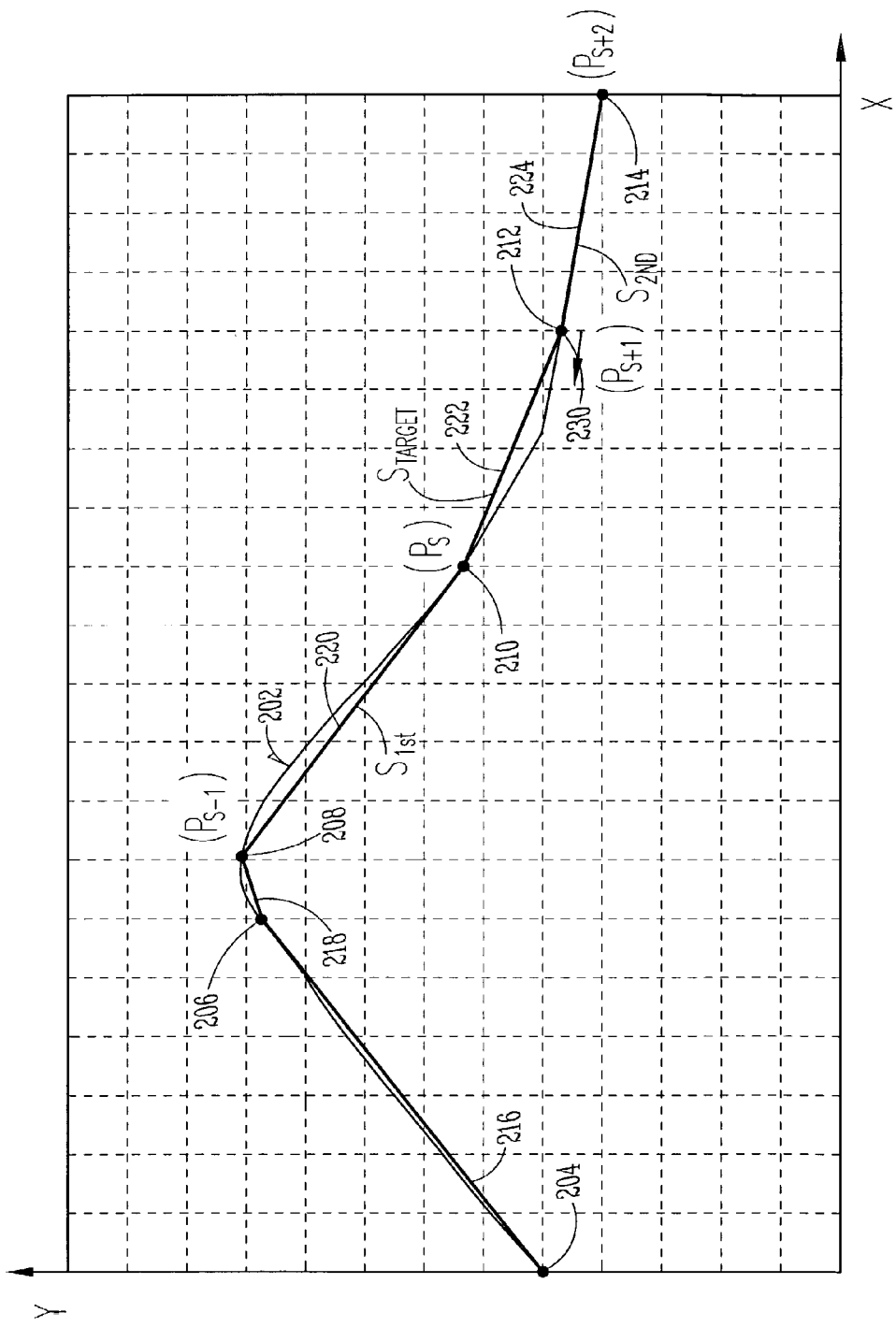

Referring to FIG. 2D, the interpolation error is determined for each of the five segments 216, 218, 220, 222 and 224 defined by the six subset data points 204, 206, 208, 210, 212 and 214 in the subset. Segment 222 has the largest interpolation error, and thus is classified as $S_{TARGET}$. As a result, data point 210 is labeled $P_S$, data point 212 is labeled $P_{S+1}$, data point 214 is labeled $P_{S+2}$ and data point 208 is labeled $P_{S-1}$. Additionally, segment 220, which has endpoints defined by $P_{S-1}$ and $P_S$, is labeled $S_{1st}$, and segment 224, which has endpoints defined by $P_{S+1}$ and $P_{S+2}$, is labeled $S_{2nd}$. In FIG. 2D, $S_{2nd}$ has a smaller interpolation error than $S_{1st}$. Therefore, data point $P_{S+1}$ is the chosen point 230 to be moved to shorten $S_{TARGET}$ and lengthen $S_{2nd}$ as illustrated by the direction of the arrow. The subset of data points 204, 206, 208, 210, 212 and 214 are now positioned as illustrated in FIG. 2E.

Figure 2E:
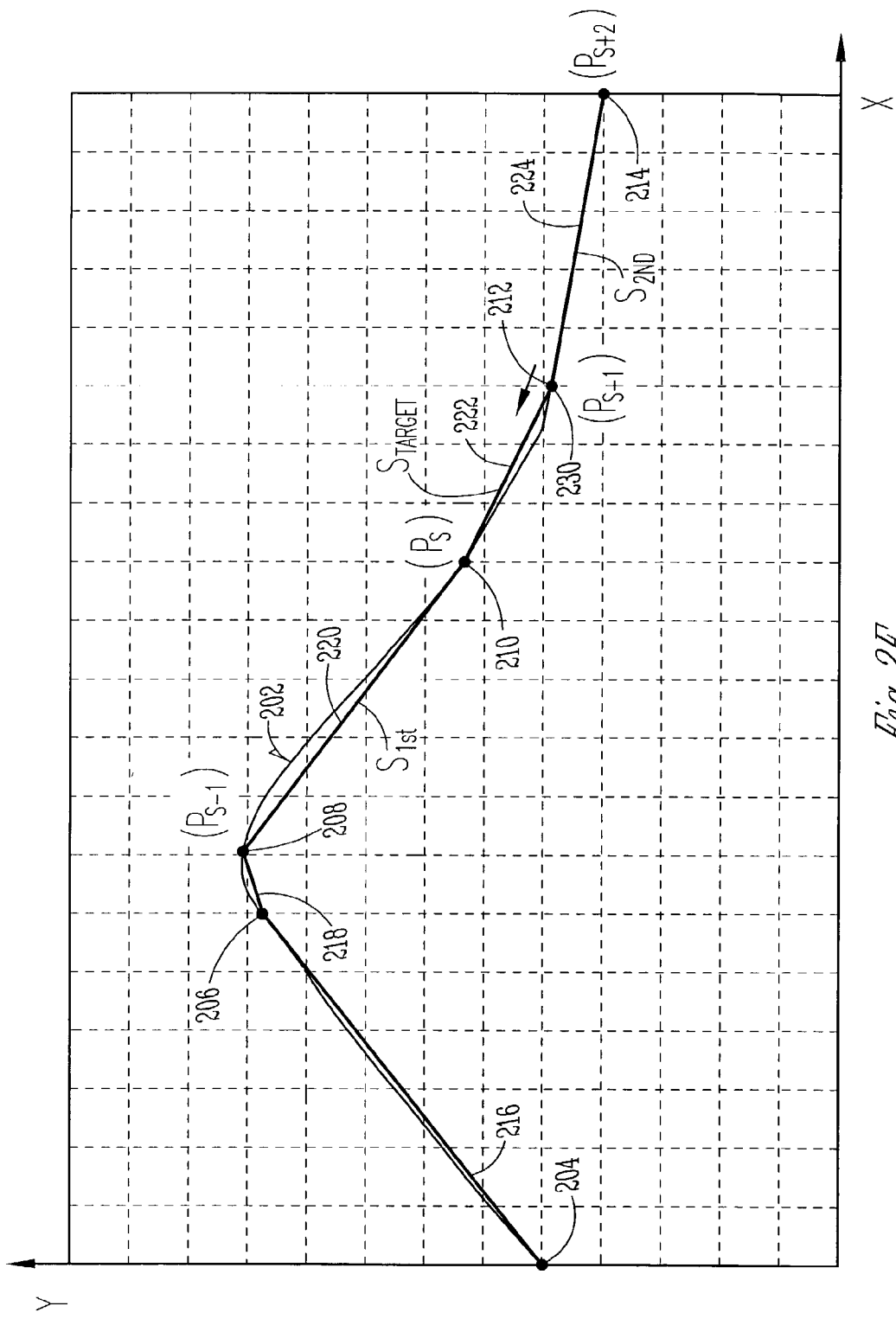

Referring to FIG. 2E, the interpolation error is determined for each of the five segments 216, 218, 220, 222 and 224 defined by the six subset data points 204, 206, 208, 210, 212 and 214 in the subset. Segment 222 has the largest interpolation error, and thus is classified as $S_{TARGET}$. As a result, data point 210 is labeled $P_S$, data point 212 is labeled $P_{S+1}$, data point 214 is labeled $P_{S+2}$ and data point 208 is labeled $P_{S-1}$. Additionally, segment 220, which has endpoints defined by $P_{S-1}$ and $P_S$, is labeled $S_{1st}$, and segment 224, which has endpoints defined by $P_{S+1}$ and $P_{S+2}$, is labeled $S_{2nd}$. In FIG. 2E, $S_{2nd}$ has a smaller interpolation error than $S_{1st}$. Therefore, data point $P_{S+1}$ is the chosen point 230 to be moved to shorten $S_{TARGET}$ and lengthen $S_{2nd}$ as illustrated by the direction of the arrow. The subset of data points 204, 206, 208, 210, 212 and 214 are now positioned as illustrated in FIG. 2F.

Figure 2F:
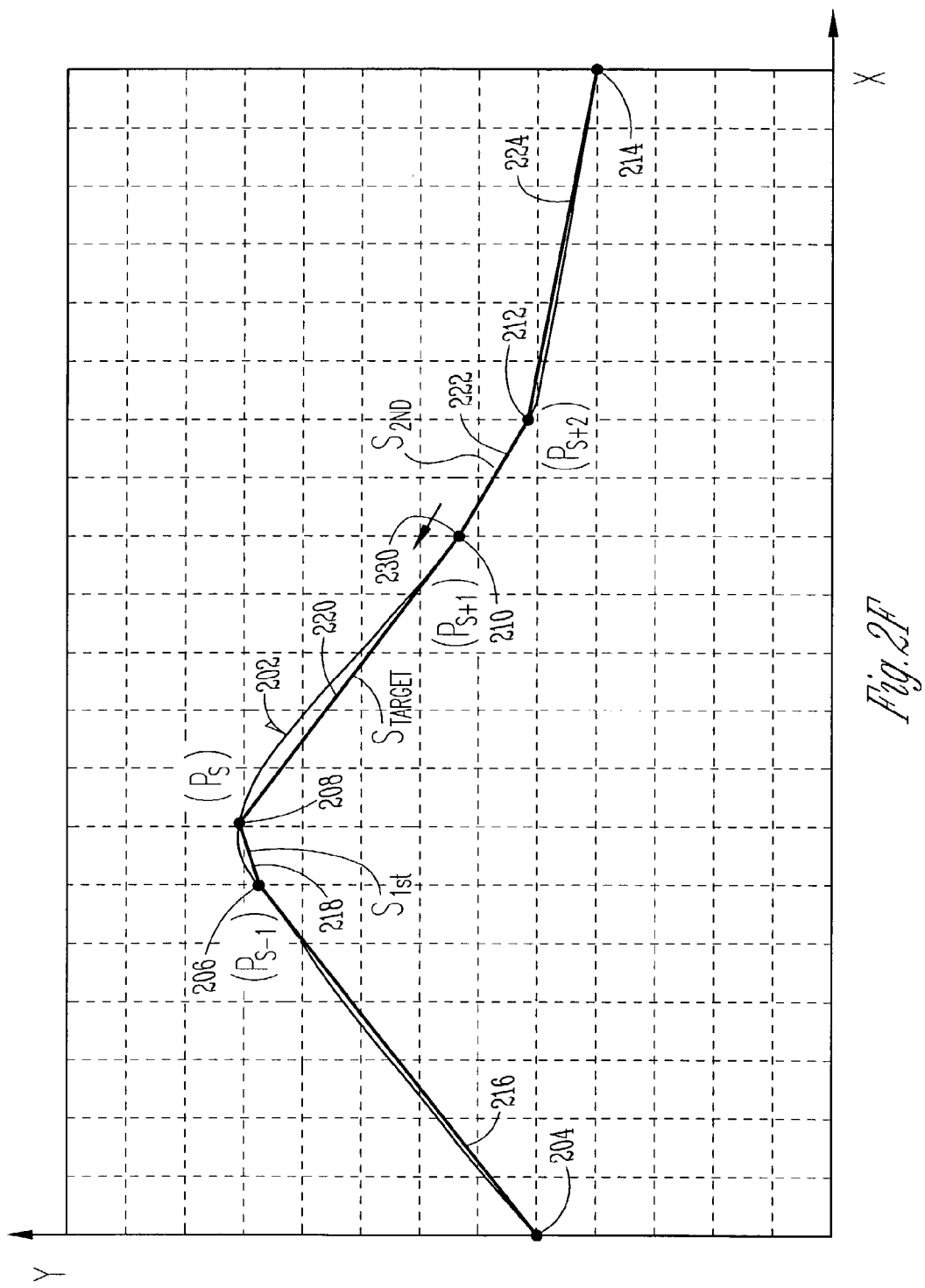

Referring to FIG. 2F, the interpolation error is determined for each of the five segments 216, 218, 220, 222 and 224 defined by the six subset data points 204, 206, 208, 210, 212 and 214 in the subset. Segment 220 has the largest interpolation error, and thus is classified as $S_{TARGET}$. As a result, data point 208 is labeled $P_S$, data point 210 is labeled $P_{S+1}$, data point 212 is labeled $P_{S+2}$ and data point 206 is labeled $P_{S-1}$. Additionally, segment 218, which has endpoints defined by $P_{S-1}$ and $P_S$, is labeled $S_{1st}$, and segment 222, which has endpoints defined by $P_{S+1}$ and $P_{S+2}$, is labeled $S_{2nd}$. In FIG. 2F, $S_{2nd}$ has a smaller interpolation error than $S_{1st}$. Therefore, data point $P_{S+1}$ is the chosen point 230 to be moved to shorten $S_{TARGET}$ and lengthen $S_{2nd}$ as illustrated by the direction of the arrow. The subset of data points 204, 206, 208, 210, 212 and 214 are now positioned as illustrated in FIG. 2G.

Figure 2G:
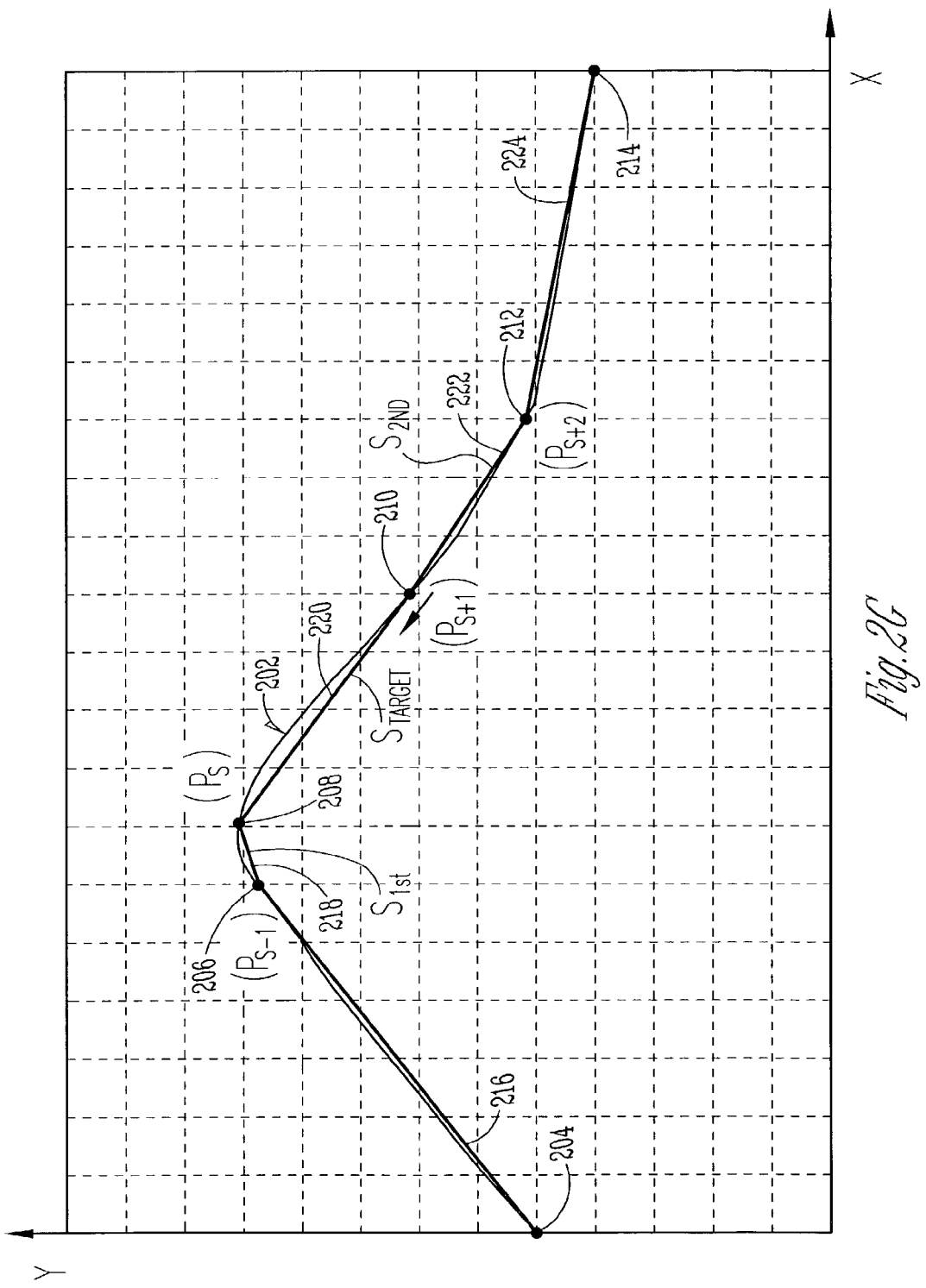

Referring to FIG. 2G, the interpolation error is determined for each of the five segments 216, 218, 220, 222 and 224 defined by the six subset data points 204, 206, 208, 210, 212 and 214 in the subset. Segment 220 has the largest interpolation error, and thus is classified as $S_{TARGET}$. As a result, data point 208 is labeled $P_S$, data point 210 is labeled $P_{S+1}$, data point 212 is labeled $P_{S+2}$ and data point 206 is labeled $P_{S-1}$. Additionally, segment 218, which has endpoints defined by $P_{S-1}$ and $P_S$, is labeled $S_{1st}$, and segment 222, which has endpoints defined by $P_{S+1}$ and $P_{S+2}$, is labeled $S_{2nd}$. In FIG. 2G, $S_{2nd}$ has a smaller interpolation error than $S_{1st}$. Therefore, data point $P_{S+1}$ is the chosen point 230 to be moved to shorten $S_{TARGET}$ and lengthen $S_{2nd}$ as illustrated by the direction of the arrow. The subset of data points 204, 206, 208, 210, 212 and 214 are now positioned as illustrated in FIG. 2H.

Figure 2H:
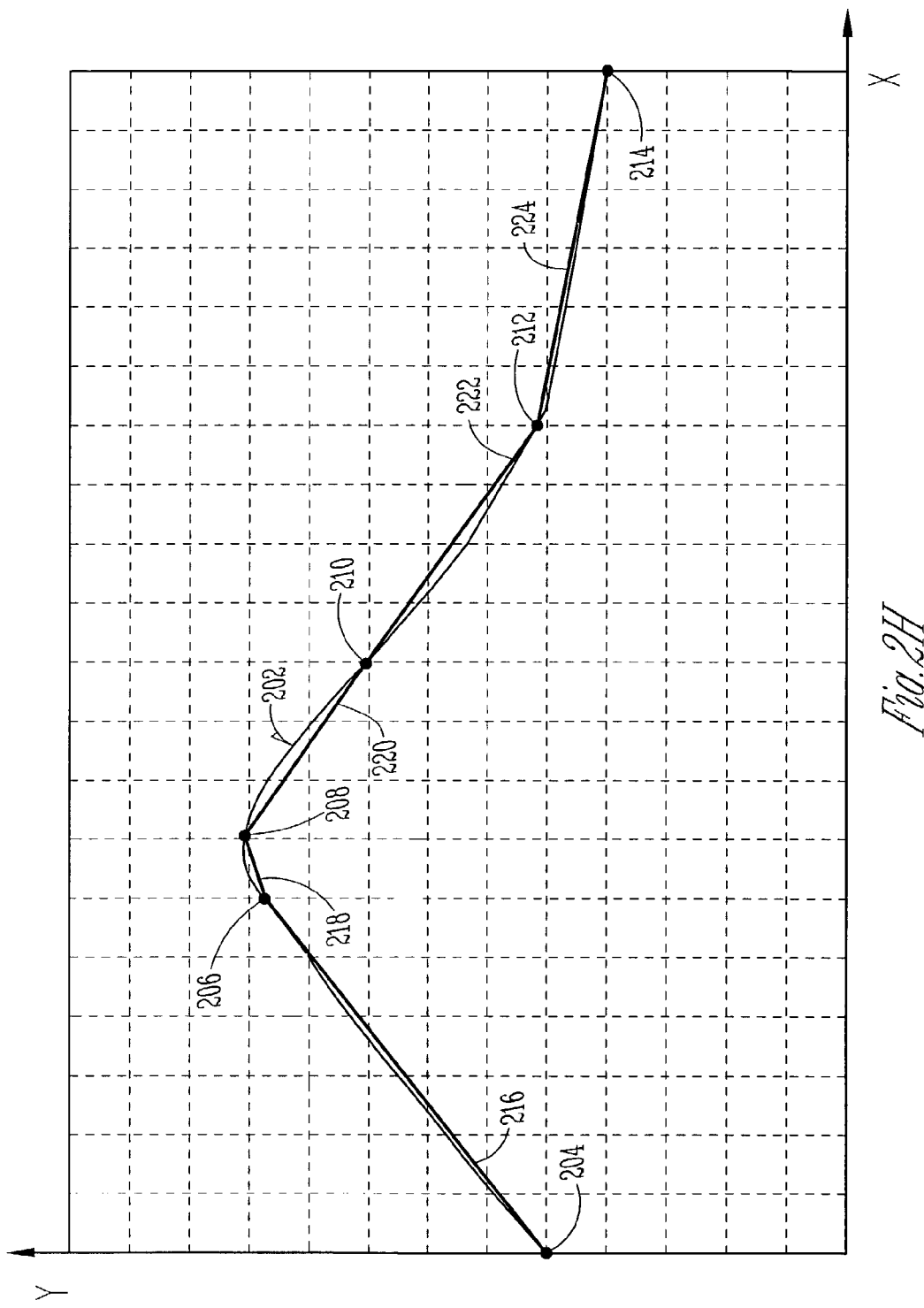

FIG. 2H shows the end of the iterative process used to select the best fit subset data points for the original data source 202. Comparing FIG. 2A and FIG. 2H, it is seen that, although some error has been introduced for segments 216 and 224, the interpolation error for segments 218 and 222 have been reduced considerably to a point that the overall interpolation error between the original data source 202 and the data subset of points 204, 206, 208, 210 and 212 has been minimized. The six data points represented in FIG. 2H are considered best fit subset data points as they minimize the interpolation error and provide a close representation of the curve for the data source 202.

It is seen in FIGS. 2A–2H that the interpolation error associated with a target segment is reduced by shortening the target segment. At least one other segment must be lengthened to shorten the target segment. Since only one subset data point is moved for each iteration, a segment adjacent the target segment will be lengthened. Lengthening a segment may introduce interpolation error that is associated with that segment. As such, if there is an adjacent segment on both ends of the target segment, the segment with the lowest interpolation error is lengthened.

Figure 3:
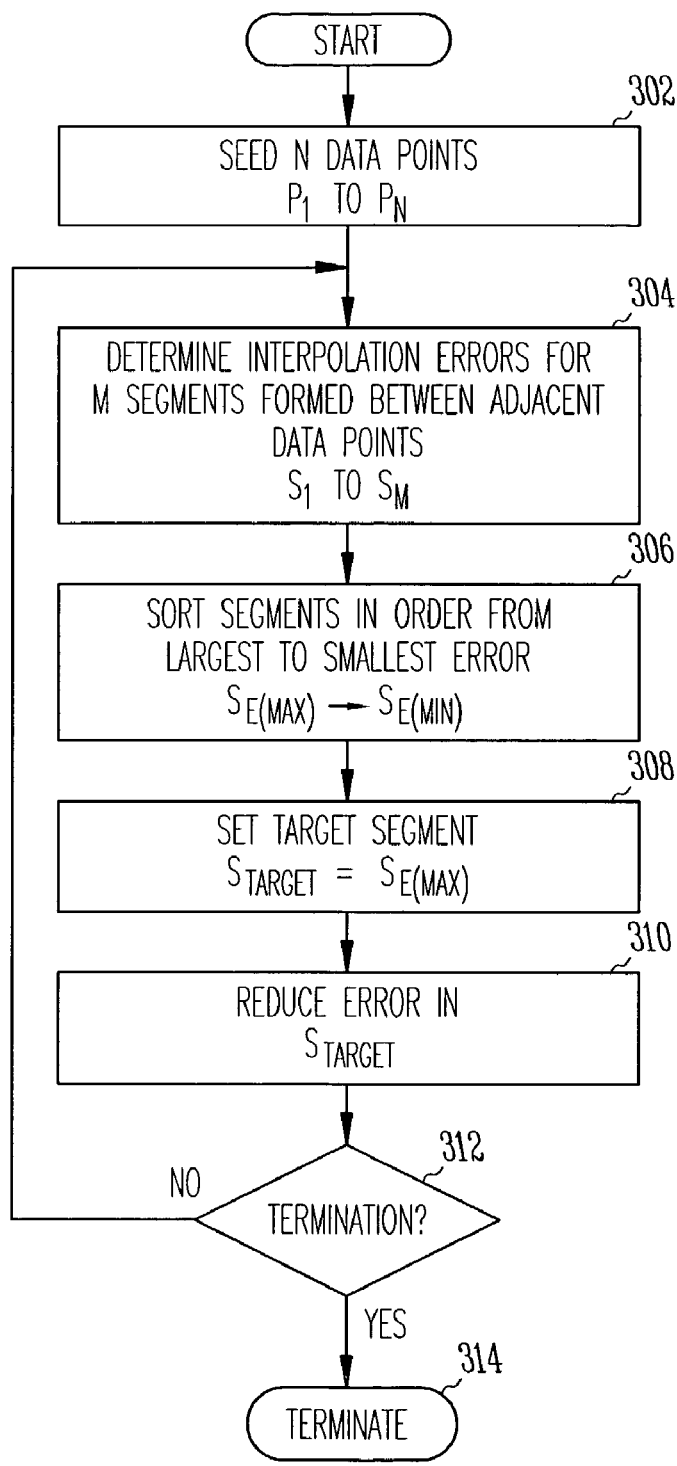
FIG. 3 is a flow chart illustrating an embodiment of one method of the present invention.

FIG. 3 is a flow chart illustrating an embodiment of one method of the present invention. According to this embodiment, N data points are seeded on the data source at 302. These N data points ($P_1$ to $P_N$) form the data subset, and are referred to as subset data points. At 304, the interpolation errors for M segments ($S_1$ to $S_M$) are calculated or otherwise determined. These M segments are capable of being formed between adjacent data points during an interpolation. The number of segments M is one less than the number of data points N (M=N-1). The segments are sorted according to their interpolation error at 306. For example, the segments are sorted in order from the largest interpolation error ($S_{E(MAX)}$) to the smallest interpolation error ($S_{E(MIN)}$). Each of the M segments ($S_1$ to $S_M$) corresponds to one of the values of the sorted segments ($S_{E(MAX)}$ to $S_{E(MIN)}$). At 308, a target segment ($S_{TARGET}$) is identified, set or otherwise determined. Initially, $S_{TARGET}$ is set to be the segment with the largest error ($S_{E(MAX)}$). Thereafter, $S_{TARGET}$ is typically set to $S_{E(MAX)}$ for each iteration in which the interpolation errors are determined at 304 and the segments are sorted at 308. However, occasionally, a local minima is found in the data source that causes the iterative process to be stuck. In this situation, $S_{TARGET}$ is "decremented" ($S_{TARGET}-1$) such that the new $S_{TARGET}$ is the segment with the next largest error ($S_{E(MAX)-1}$). At 310, the interpolation error for $S_{TARGET}$ is reduced by moving one subset data point. At 312, a termination check is performed. Upon determining that the iterative process is to continue, the method proceeds to 304 where the interpolation errors are recalculated for the newly position data points. Upon determining that the iterative process is to end, the process proceeds to 314 where the process is terminated and the resulting best fit subset data points are identified.

Figure 4:
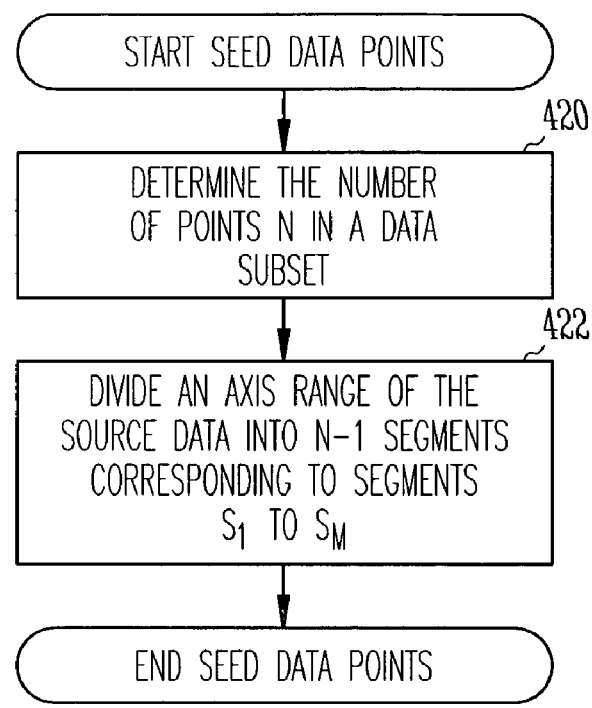
FIG. 4 is a flow chart further illustrating one embodiment of a method for seeding N data points.

FIG. 4 is a flow chart further illustrating one embodiment of a method for seeding N subset data points, such as the method previously illustrated at 302 in FIG. 3. According to this method, the number of data points N for a data subset is determined at 420. This number may be controlled by external factors. Examples of such factors include the available size of a model table or the bandwidth and/or storage capabilities for a system. At 422, an axis range of the data source is divided into N-1 ($S_1$ to $S_M$) segments of equal length. This was previously illustrated in the example provided with respect to FIG. 2A, in which six subset data points were evenly distributed across the data source such that five segments could be formed between adjacent data points. Evenly distributing the seed values across the range of the sampled data source captures the data's range so that the subset of data points do not become trapped by local minima during the iteration to the best fit.

Figure 5A:
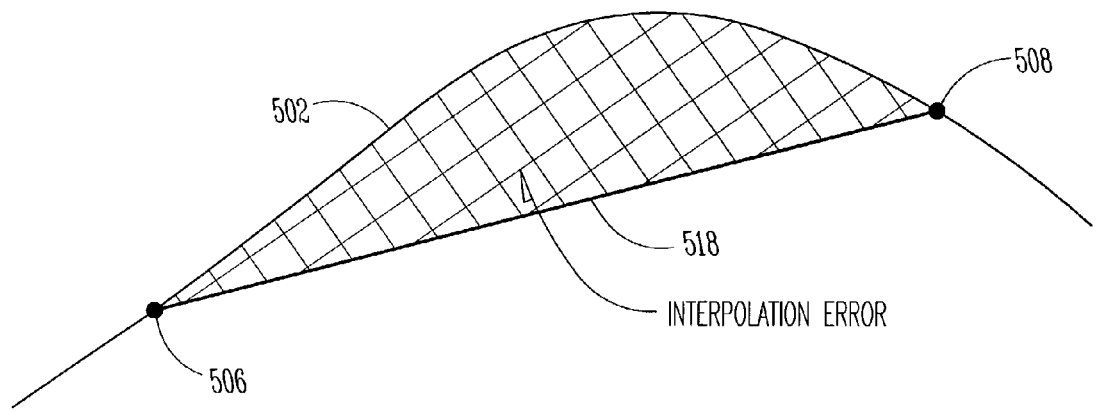
FIG. 5A shows a portion of FIG. 2B and illustrates the linear interpolation error between two adjacent data points.

FIG. 5A shows a portion of FIG. 2B and illustrates the linear interpolation error between two adjacent data points. The interpolation error is determined at 304 in FIG. 3. Referring again to FIG. 5, the linear interpolation error is represented as the area between the data source 502 and segment 518, which has endpoints defined by data points 506 and 508. One of ordinary skill in the art will understand, upon reading and understanding this disclosure, that there are a number of methods for quantifying the linear interpolation error associated with each segment. These methods include calculating or approximating the area between the source 502 and segment 518, or an average distance between the source data 502 and the segment 518. According to one embodiment, determining a linear interpolation error for a segment includes determining the maximum distance between the segment 518 and the data source 502. One of ordinary skill in the art will understand, upon reading and understanding this disclosure, that there are many different ways of determining the maximum distance.

The present invention is not limited to a particular dimension or to a particular coordinate system. Methods for determining a maximum distance for a two-dimensional Cartesian coordinate system are provided herein. One of ordinary skill in the art would know, upon reading and understanding this disclosure, how to apply the teachings contained herein to other dimensions and coordinate systems. In a Cartesian coordinate system, the distance between two points ($P_1$ and $P_2$) can be defined by the following equation:

$$|P_1P_2| = \sqrt{(X(P_1)-X(P_2))^2 + (Y(P_1)-Y(P_2))^2}, \text{ or}$$

$$|P_1P_2| = \sqrt{(X(P_{DATA})-X(P_{SEG}))^2 + (Y(P_{DATA})-Y(P_{SEG}))^2}.$$

The variable X(P) is the X-axis value of a point P, and the variable Y(P) is the Y-axis value of the point P.

Figure 5B:
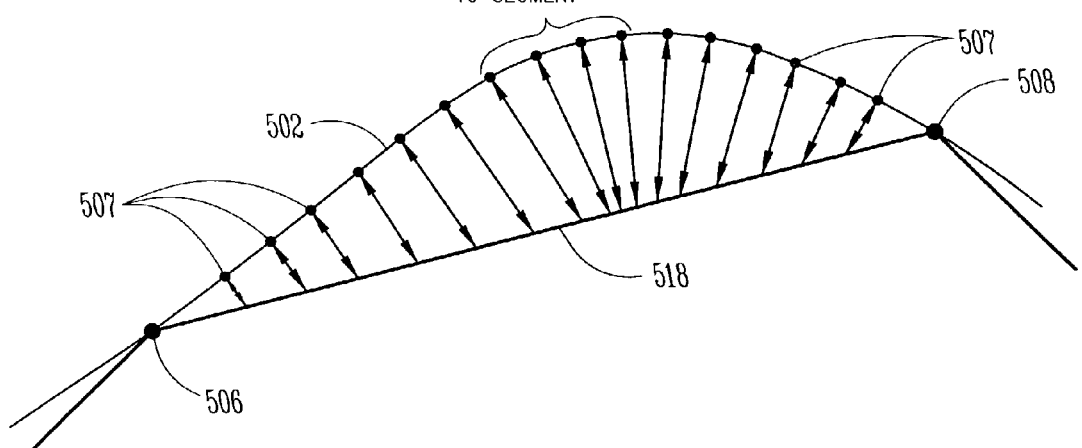
FIG. 5B shows a portion of FIG. 2B and illustrates one embodiment of a method for determining the linear interpolation error between two adjacent data points.

FIG. 5B shows a portion of FIG. 2B and illustrates one method for determining the linear interpolation error between two adjacent data points. According to this example, for each sample point 507 in the data source 502, a corresponding point in the segment 518 is identified that is normal to the representative curve of the data source 502. These corresponding pairs of points are represented as the endpoints of the normal vectors provided in FIG. 5B. One of ordinary skill in the art, upon reading and understanding this disclosure, would know how to identify a point in the segment 518 that is normal to the curve of the data source 502 at a particular sample point 507. The above-identified distance formula can be used to determine the maximum distance between the data source 502 and the segment 518. In the illustration of FIG. 5B, about four normal vectors are approximately equal in length. The length of the longest vector is quantified. The result is a quantified linear interpolation error for segment 518.

Figure 5C:
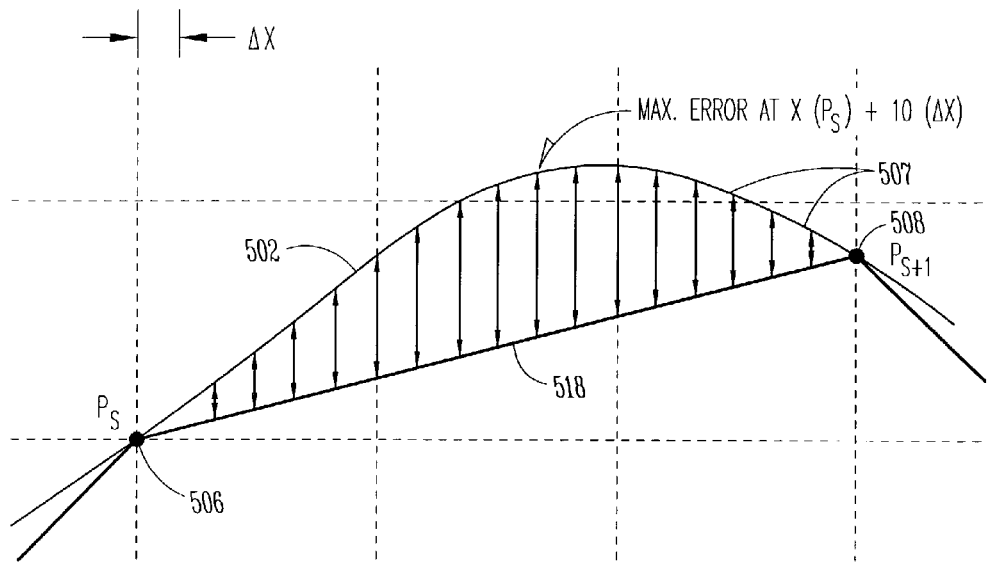
FIG. 5C shows a portion of FIG. 2B and illustrates one embodiment of a method for determining the linear interpolation error between two adjacent data points.

FIG. 5C shows a portion of FIG. 2B and illustrates another method for determining the linear interpolation error between two adjacent data points. According to this method, $P_1$ and $P_2$ are chosen so that the X value of $P_1$ ($X(P_1)$) is equal to the X value of $P_2$ ($X(P_2)$). If $X(P_1)$ equals $X(P_2)$, then the distance formula reduces to the following:

$$|P_1P_2| = |Y(P_1)-Y(P_2)| = |Y(P_{DATA})-Y(P_{SEG})|.$$

FIG. 5C illustrates vertical vectors between the segment 518 and the data source 502. The vertical vectors are spaced apart by a $\Delta X$. As illustrated, the longest vertical vector, and thus the maximum linear interpolation error, occurs at $X(P_S)+10(\Delta X)$. The length of this longest vector is quantified. The result is a quantified linear interpolation error for segment 518. According to one embodiment, where the interpolation errors are being minimized for design tools, the method illustrated by FIG. 5C is useful because the calculation represents the actual error in the data that will be seen by the design tools.

Figure 5D:
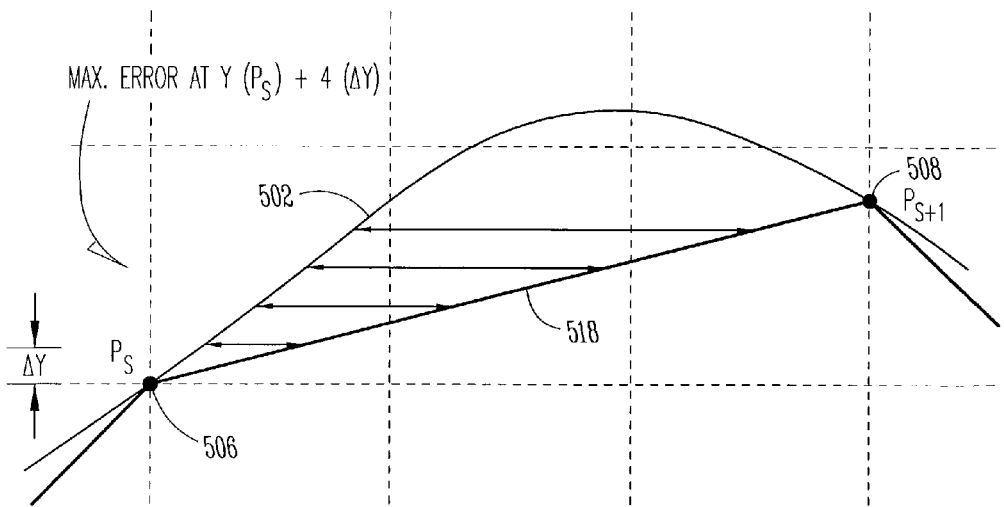
FIG. 5D shows a portion of FIG. 2B and illustrates one embodiment of a method for determining the linear interpolation error between two adjacent data points

FIG. 5D shows a portion of FIG. 2B and illustrates another method for quantifying the linear interpolation error between two adjacent data points. According to this method, $P_1$ and $P_2$ are chosen so that the Y value of $P_1$ ($Y(P_1)$) is equal to the Y value of $P_2$ ($Y(P_2)$). If $Y(P_1)$ equals $Y(P_2)$, then the distance formula reduces to the following:

$$|P_1P_2| = |X(P_1)-X(P_2)| = |X(P_{DATA})-X(P_{SEG})|.$$

FIG. 5D illustrates horizontal vectors between the segment 518 and the data source 502. The horizontal vectors are spaced apart by a $\Delta Y$. As illustrated, the longest vertical vector, and thus the maximum linear interpolation error, occurs at $Y(P_S)+4(\Delta Y)$. The length of this longest vector is quantified. The result is a quantified linear interpolation error for segment 518.

Figure 6:
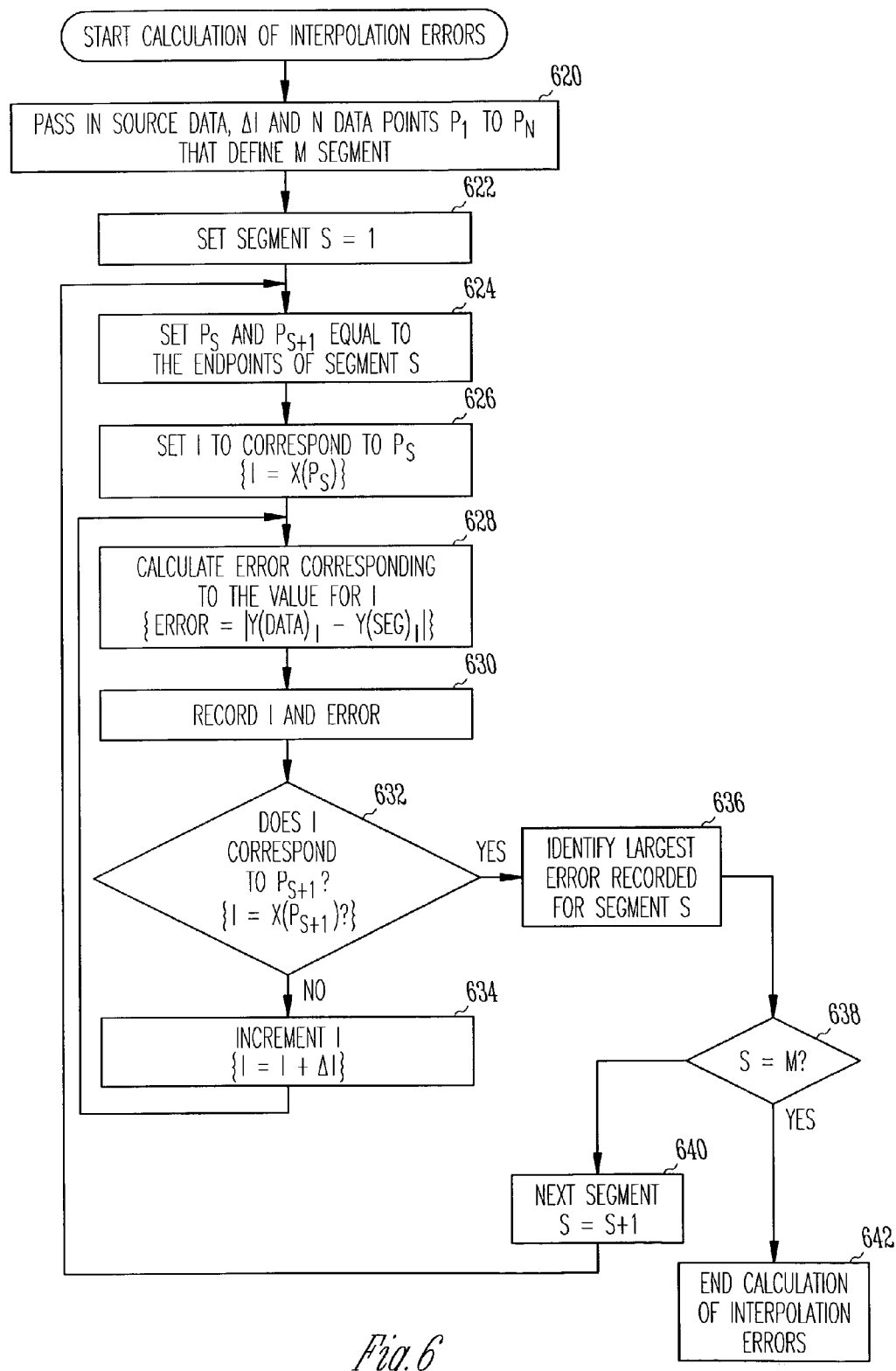
FIG. 6 is a flow chart further illustrating one embodiment of a method for quantifying interpolation errors.

FIG. 6 is a flow chart further illustrating one embodiment of method for quantifying interpolation errors, such as the method previously illustrated at 304 in FIG. 3. According to this embodiment, several known values are retrieved or passed in at 620 to be used in the process. These known values include the data source, an increment variable ($\Delta I$), and N subset data points ($P_1$ to $P_N$). M segments ($S_1$ to $S_M$) can be formed from adjacent N subset data points. The variable $\Delta I$ is used to evaluate and quantify interpolation errors at incremental points between the adjacent subset data points that form endpoints of a segment. An interpolation error is determined for each of the M segments. At 622, a segment variable S is set to 1 so that a first segment is evaluated first. At 624, endpoint variables $P_S$ and $P_{S+1}$ are set or otherwise identified with the appropriate subset data points for segment S. Points between the subset data points $P_S$ and $P_{S+1}$ are to be evaluated. To this end, at 624, a variable I is set to correspond to one of the endpoint variables $P_S$. The variable I is incremented by $\Delta I$ to evaluate the points between the subset data points. For the example illustrated in FIG. 5C, the variable I could be set to $X(P_S)$. At 628, the interpolation error is determined corresponding to the incremental point value provided by the variable I. For the example illustrated in FIG. 5C, the error is determined by the absolute value of the difference between the Y value for the data source at point I ($Y(DATA)_I$) and the Y value for the segment at point I. ($Y(SEG)_I$). At 630, both the value of the variable I and corresponding interpolation error are recorded for later comparison. At 632, it is determined whether the increment variable I corresponds to the second endpoint ($P_{S+1}$) of segment S. For the example illustrated in FIG. 5C, it is determined whether the variable I equals $X(P_{S+1})$. Upon determining that the variable I does not correspond to $P_{S+1}$, the variable I is incremented by $\Delta I$ at 634, and the process returns to 628 to calculate and record the interpolation error for the next incremental point. Upon determining that the variable I corresponds to $P_{S+1}$, the largest error recorded for segment S is identified at 636. At 638, it is determined whether the segment variable S equals the value M; that is, whether the last segment has been evaluated. Upon determining that S does not equal the value M, the segment variable S is incremented to S+1 at 640, and the process returns to 624 to evaluate the next segment. Upon determining that S equals the value M, the process proceeds to 642 to end the calculation of interpolation errors.

Figure 7:
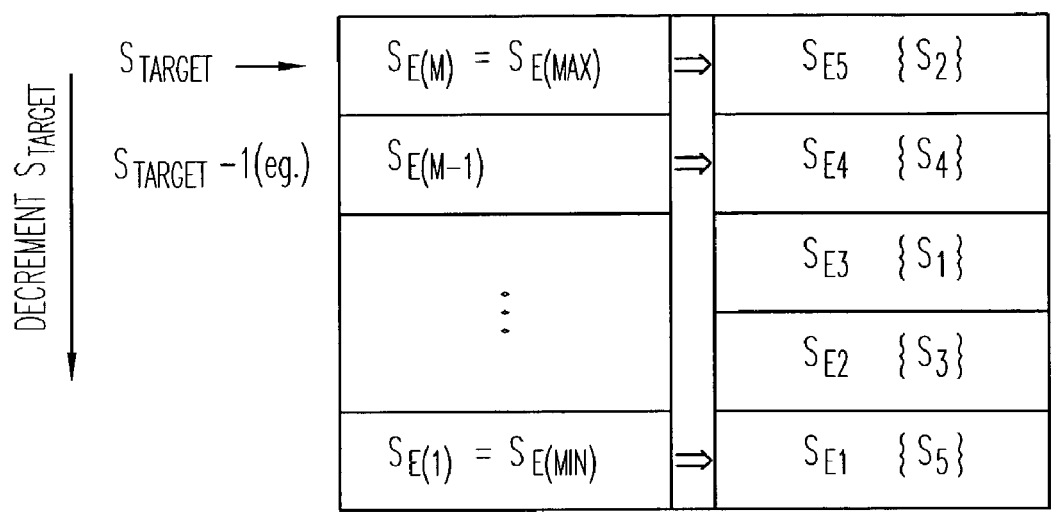
FIG. 7 is an illustration of interpolation segments sorted in order from the segment with the largest interpolation error to the segment with the smallest interpolation error, and further is an illustration of target segment selection.

FIG. 7 is an illustration of interpolation segments sorted in order from the segment with the largest interpolation error to the segment with the smallest interpolation error, and further is an illustration of target segment selection, such as the method previously illustrated at 306 and 308 in FIG. 3. According to this example, the M segments are sorted according to their interpolation error, from segment with the largest interpolation error ($S_{E(M)}$ or $S_{E(MAX)}$) to the segment with the smallest interpolation error ($S_{E(1)}$ or $S_{E(MIN)}$). For the example illustrated in FIG. 2A, the five segments $S_1$ to $S_5$ are sorted in order from largest interpolation error $S_{E5}$ to smallest interpolation error $S_{E1}$. In that example, segment $S_2$ is the segment with the worst error ($S_{E5}$), segment $S_4$ is the segment with the next worst error ($S_{E4}$), segment $S_1$ is the segment with the next worst error after $S_{E4}$ ($S_{E3}$), segment $S_3$ is the segment with the next worst error after $S_{E3}$ ($S_{E2}$), and segment $S_5$ is the segment with the smallest error ($S_{E1}$). For each iteration, $S_{E(MAX)}$ is typically identified as the target segment ($S_{TARGET}$) to be shortened in an effort to reduce interpolation error. There are situations in which $S_{TARGET}$ is not $S_{E(MAX)}$. One situation is where the two adjacent segments to $S_{TARGET}$ have equally large errors. Another situation is where the process is effectively stuck moving one point back and forth; that is, the point oscillates about a local minima during the successive iterations. In these situations $S_{TARGET}$ is decremented, as shown by the direction of the arrow in FIG. 7, to the segment with the next largest error ($S_{TARGET}-1$). If the process still is stuck, the $S_{TARGET}$ is decremented again. These situation are described below in more detail.

Figure 8:
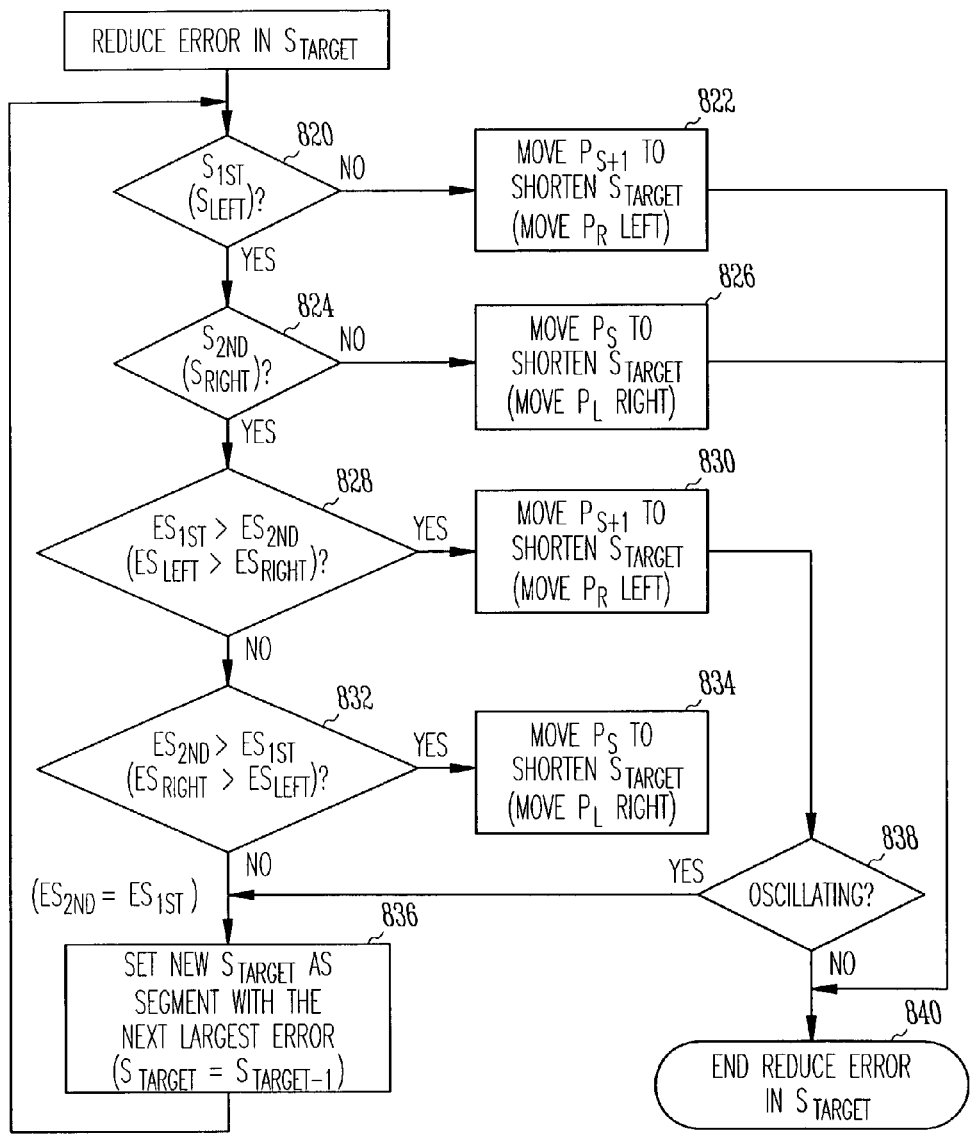
FIG. 8 is a flow chart further illustrating one embodiment of a method for reducing the interpolation error in a target segment.

FIG. 8 is a flow chart further illustrating one embodiment of method for reducing the interpolation error in a target segment, such as the method previously illustrated at 310 in FIG. 3. Referring again to the example illustrated in FIGS. 2A–2H for the purpose of review, given a series of subset data points, $S_{1st}$ is the segment that has endpoints $P_{S-1}$ and $P_S$, $S_{TARGET}$ is the segment that has endpoints $P_S$ and $P_{S+1}$, and $S_{2nd}$ is the segment that has endpoints $P_{S+1}$ and $P_{S+2}$. In these illustrations, $S_{1st}$ may be referred to as $S_{LEFT}$ since it is the left adjacent segment with respect to $S_{TARGET}$, and $S_{2nd}$ may be referred to as $S_{RIGHT}$ since it is the right adjacent segment with respect to $S_{TARGET}$. However, the invention is not limited to a particular orientation.

According to the method illustrated in FIG. 8, it is determined whether there is a first adjacent segment ($S_{1st}$) at 820. That is, in the example shown in FIGS. 2A–2H, is there an adjacent segment on the left side of $S_{TARGET}$? Upon determining that there is no $S_{1st}$, the process proceeds to 822 where the subset data point $P_{S+1}$, is moved to shorten $S_{TARGET}$, and then proceeds to 840. In the example shown in FIGS. 2A–2H, the right endpoint ($P_R$) of $S_{TARGET}$ would be moved left if an adjacent segment is not on the left side. Upon determining that there is a $S_{1st}$, the process proceeds to 824 to determine whether there is a second adjacent segment ($S_{2nd}$). That is, in the example shown in FIGS. 2A–2H, is there an adjacent segment on the right side of $S_{TARGET}$? Upon determining that there is no $S_{2nd}$, the process proceeds to 826 where the subset data point $P_S$ is moved to shorten $S_{TARGET}$, and then proceeds to 840. In the example shown in FIGS. 2A–2H, the left endpoint ($P_L$) of $S_{TARGET}$ is moved right if an adjacent segment is not on the right side. Upon determining that there is a $S_{2nd}$, the process proceeds to 828 to determine whether the interpolation error for $S_{1st}$ ($ES_{1st}$) is larger than the interpolation error for $S_{2nd}$ ($ES_{2nd}$). Upon determining that $ES_{1st}$ is larger than $ES_{2nd}$, the process proceeds to 830 to move $P_{S+1}$ to shorten $S_{TARGET}$. Upon determining that $ES_{1st}$ is not larger than $ES_{2nd}$, the process proceeds to 832 to determine whether $ES_{2nd}$ is larger than $ES_{1st}$. Upon determining that $ES_{2nd}$ is larger than $ES_{1st}$, the process proceeds to 834 to move $P_S$ to shorten $S_{TARGET}$. Upon determining that $ES_{2nd}$ is not larger than $ES_{1st}$ (a condition in which $ES_{2nd}$ equals $ES_{1st}$), the process proceeds to 836 to set a new $S_{TARGET}$ as the segment with the next largest error, i.e. decrement $S_{TARGET}$, and return to 820 to reduce the error in the new $S_{TARGET}$. Upon leaving 830 in which $P_{S+1}$ was moved or 834 in which $P_S$ was moved, proceeding to 838 to determine whether the system is oscillating the same subset data point between positions during successive iterations. This is a situation in which the iterative process is essentially stuck processing two adjacent segments as the target segments and moving the common subset data point for both segments. Upon determining that the system is oscillating, the process proceeds to 836 to evaluate the segment with the next largest error. Upon determining that the system is not oscillating, the process proceeds to 840 for the purpose of ending the process of reducing error in $S_{TARGET}$ for that iteration.

Figure 9:
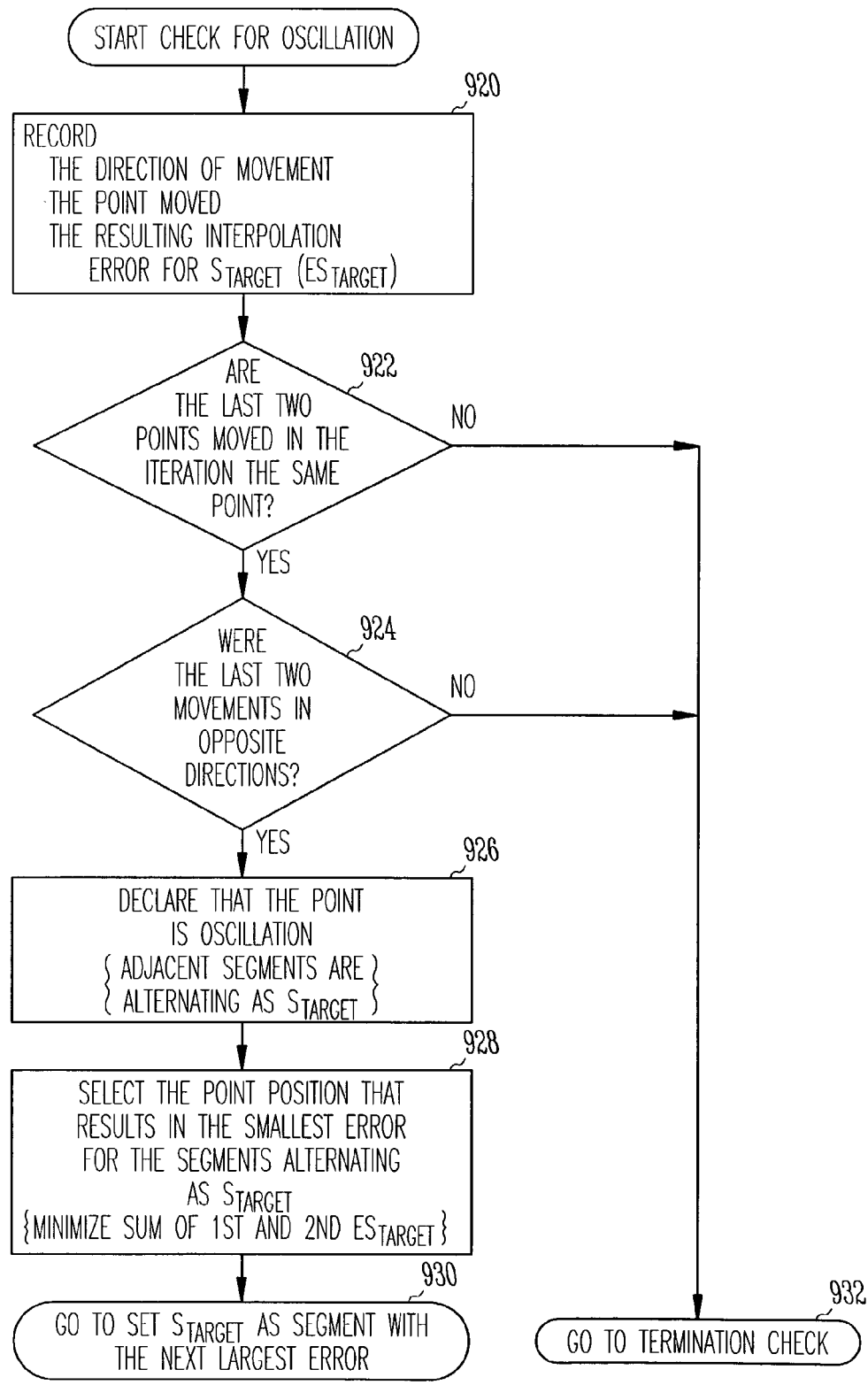
FIG. 9 is a flow chart further illustrating one embodiment of a method for performing an oscillation check.

FIG. 9 is a flow chart further illustrating one embodiment of a method for performing an oscillation check, such as the method previously illustrated at 838 in FIG. 8. According to this method, the subset data point moved, the direction of movement, and the resulting interpolation error for $S_{TARGET}$ ($ES_{TARGET}$) are recorded at 920. A determination is made at 922 whether the last two points moved in the last two successive iterations are the same subset data point. Upon determining that the last two points moved are not the same subset data point, the process proceeds to 932 for the purpose of proceeding to a termination check. Upon determining that the last two points moved are the same subset data point, the process proceeds to 924 to determine if the last two movements of the subset data point were in opposite directions. Upon determining that the last two movements of the subset data point were not in opposite directions, the process proceeds to 932 for the purpose of proceeding to a termination check. Upon determining that the last two movements of the subset data point were in opposite directions, the process proceeds to 926 where a declaration or other determination is made that the system is oscillating. It is noted that, since the system is oscillating, adjacent segments will alternate as $S_{TARGET}$ for successive iterations. At 928, the subset data point is moved to a position that results in the smallest amount of interpolation error for the combination of the two adjacent segments that are alternating as $S_{TARGET}$. That is, according to one embodiment, the subset data point is moved to a position that results in the smallest sum of the error for the first target segment and the error for the sum second target segment. The second target segment is adjacent to the first target segment and follows the first target segment in successive iterations. The system proceeds to 930 for the purpose of proceeding to 836 of FIG. 8 to set $S_{TARGET}$ as the segment with the next largest error.

Figure 10:
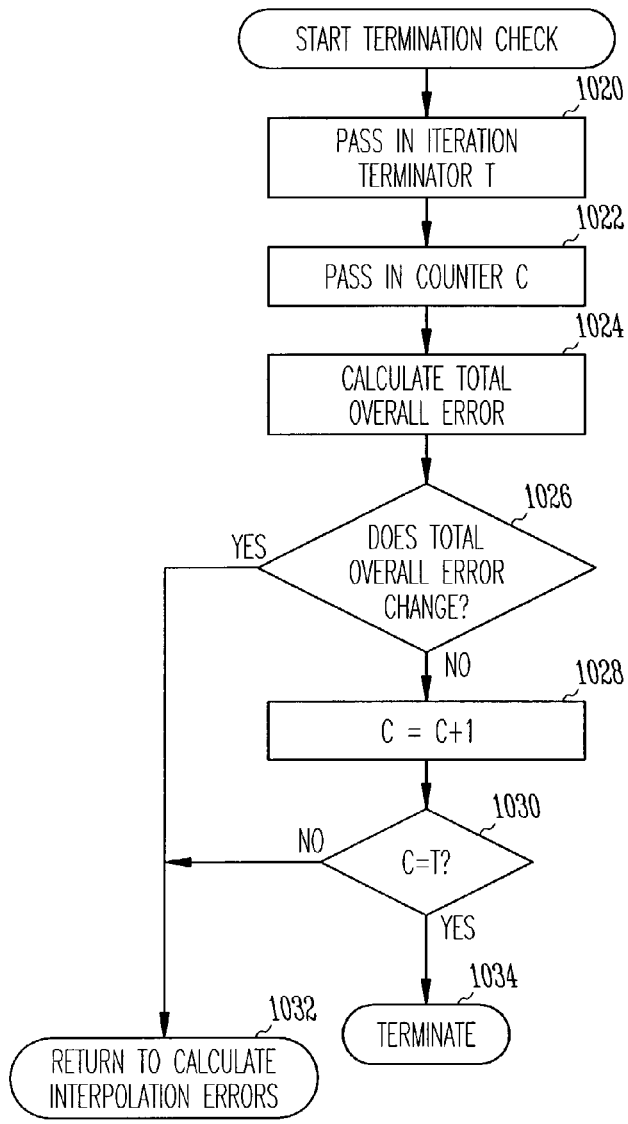
FIG. 10 is a flow chart further illustrating one embodiment of a method for performing a termination check.

FIG. 10 is a flow chart further illustrating one embodiment of a method for performing a termination check, such as the method previously illustrated at 314 in FIG. 3. According to this embodiment, a termination variable T is passed in or otherwise retrieved by the system for use in the process at 1020. According to one embodiment, the variable T is a user-programmable variable. At 1022, a counter variable C is passed in or otherwise retrieved by the system for use in the process. The process proceeds to 1024, where the total overall linear interpolation error is determined. At 1026, it is determined whether the total overall error changed. Upon determining that the total overall error changed, the process proceeds to 1032 for the purpose of proceeding to 304 of FIG. 3 to perform another iteration. Upon determining that the total overall error did not change, the process proceeds to 1028 to increment the counter variable C by one, and then the process proceeds to 1030 to determine whether the counter variable C equals the termination variable T. Upon determining that the counter variable C does not equal the termination variable T, the process proceeds to 1032 for the purpose of proceeding to 304 of FIG. 3 to perform another iteration. Upon determining that the counter variable C equals the termination variable T, the process proceeds to 1034, which corresponds to 314 of FIG. 3, where the iteration process is completed.

The subset of N data points are considered best fit data points after completion of the iterative process for reducing the interpolation error. Since the interpolation error is reduced, future interpolation of these best fit subset data points improves the representation of the original data source. In an electronics design automation process, for example, the resulting subset of N best fit data points are imported or otherwise incorporated into a model table for circuit simulations by design tools.

Figure 11:
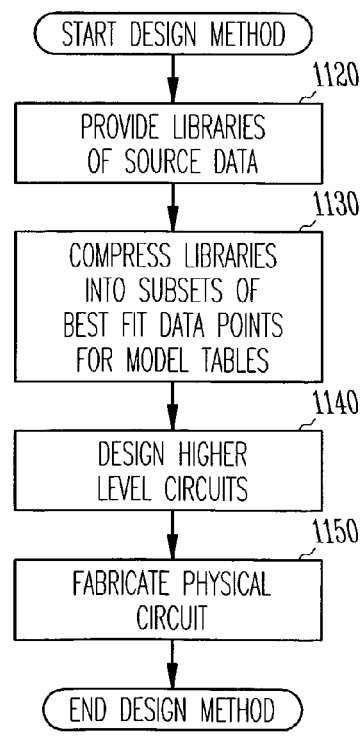
FIG. 11 is a flow chart illustrating one embodiment of an electronics design method.

FIG. 11 is a flow chart illustrating one embodiment of an electronics design method. According to this method, libraries of data source are provided at 1120. According to one embodiment, the libraries of data source include electronic cell characteristic data and electronic device characteristic data. At 1130, the libraries are compressed into a subset of best fit data points for model tables. The process for compressing the libraries into a subset of best fit data points includes the process described above with respect to FIG. 3. At 1140, higher level circuits are designed using the model tables. After the circuit design is complete, physical circuits are fabricated at 1150.

Figure 12:
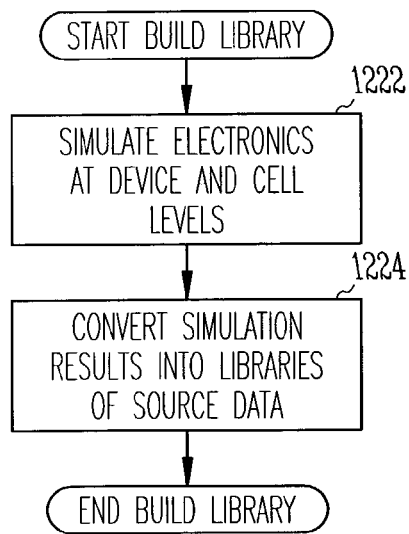
FIG. 12 is a flow chart illustrating one embodiment of a method for providing libraries of source data.

FIG. 12 is a flow chart illustrating one embodiment of a method for providing libraries of data source, such as the method previously illustrated at 1120 in FIG. 11. According to this method, simulations are performed for electronic circuits under various conditions at 1222. According to one embodiment, these simulations are performed for circuits at both device and cell levels. The process continues to 1224, where the results of these simulations are converted or otherwise provided as libraries of data source for the electronic circuits.

Figure 13:
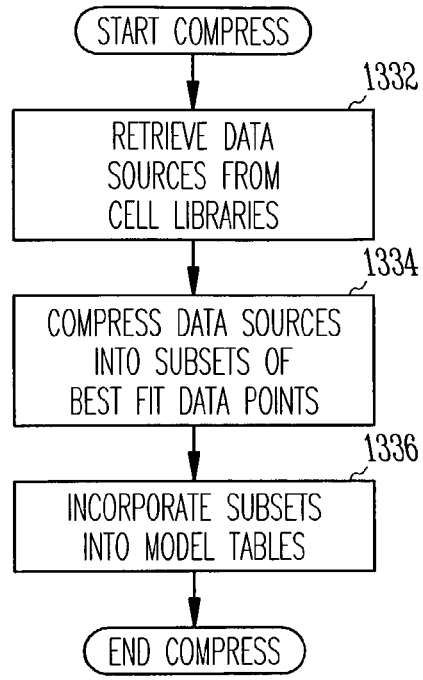
FIG. 13 is a flow chart illustrating one embodiment of a method for compressing libraries into subsets of best fit data points for model tables.

FIG. 13 is a flow chart illustrating one embodiment of a method for compressing libraries into subsets of best fit data points for model tables, such as the method previously illustrated at 1130 in FIG. 11. According to this method, data sources are received from libraries at 1332. The process proceeds to 1334, where the data sources are compressed into subsets of best fit data points. The process for compressing the data sources into subsets of best fit data points includes the process described above with respect to FIG. 3. At 1336, the subsets are incorporated into model tables. According to one embodiment, the model tables are used by automated electronics design tools.

Figure 14:
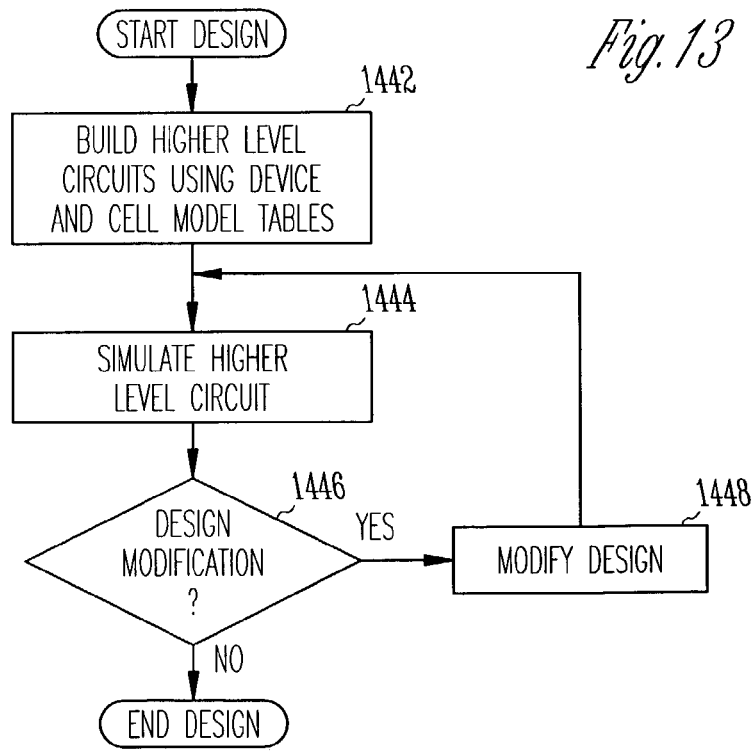
FIG. 14 is a flow chart illustrating one embodiment of a method for designing higher level circuits.

FIG. 14 is a flow chart illustrating one embodiment of a method for designing higher level circuits, such as the method previously illustrated at 1140 in FIG. 11. According to this method, beginning at 1442, higher level circuits are designed using device and cell model tables. Functional cell blocks are linked together to form larger schematics. At 1444, a simulation is performed on the higher level circuit. The results of the simulation are evaluated, and at 1446, a determination is made whether to modify the design. Upon making a determination to modify the design, the process proceeds to 1448 wherein the design is modified, and then proceeds to 1444 where the modified design is simulated. Upon making a determination not to modify the design, the process design process concludes.

FIG. 15 is a block diagram of a system according to the present invention. The electronic system 1500 includes a processor 1510, input/output devices 1520, and memory or storage 1530. The processor 1510, input/output devices 1520, and storage 1530 are operably coupled together. The input/output devices 1520 include a screen display 1522 upon which a circuit can be viewed during design, and the simulation results can be viewed. According to other embodiments, input/output devices 1520 include, but are not limited to, conventional devices such as keyboards, pointers, printers, and the like, and sampling devices for detecting and recording data from physical circuits. According to one embodiment, these sampling devices are used to develop characteristic data source.

The storage 1530 includes computer readable medium, upon which data and instructions are encoded. The storage includes storage for an operating system 1532, storage for programming code for simulations 1534, storage for data source 1536 or libraries of data source such as that which may be developed from data samples taken during the simulations, storage for programming code for compressing the data source into a subset of best fit points 1538, storage for a data subset 1540, and storage for programming code for design automation tools 1542 adapted to incorporate the data subset into model tables. The programming codes for simulations, the programming code for selecting best fit points, and the programming code for design automation include programming code to perform their respective processes as described above.

CONCLUSION

The present subject matter provides a system and method for selecting best fit subset data points to reduce or minimize linear interpolation. The method seeds subset data points on data source, and then performs an iterative method of moving the subset data points to reduce the interpolation error for the data subset. Linear interpolation of the resulting best fit subset data points accurately recreate the data source.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A computer-implemented method of adjusting a series of N subset data points into best fit data points for a series of sample data points that form a data source such that a linear interpolation of the N subset data points closely approximates the series of sample data points, wherein the N subset data points require less storage in computer-readable memory and less computer processing bandwidth than the series of sample data points, the method comprising:
  identifying M segments having endpoints defined by adjacent subset data points, wherein M equals N−1; and
  performing an iterative process, including:
    determining a linear interpolation error for each of the M segments;
    identifying a segment from the M segments with a largest interpolation error and selecting the segment with the largest interpolation error as a target segment ($S_{TARGET}$); and
    reducing the interpolation error for $S_{TARGET}$ by moving one endpoint of $S_{TARGET}$ by an increment corresponding to at least one sample data point in the series of sample data points to shorten $S_{TARGET}$.

2. The method of claim 1, wherein determining a linear interpolation error for each of the M segments includes quantifying a distance between the segment and the data source.

3. The method of claim 1, wherein reducing the interpolation error for $S_{TARGET}$ includes:
  determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
  determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);
  upon determining that there is no $S_{1ST}$, moving $P_{S+1}$ by an increment corresponding to at least one sample data point in the series of sample data points to shorten $S_{TARGET}$ and lengthen $S_{2ND}$; and
  upon determining that there is no $S_{2ND}$, moving $P_S$ by an increment corresponding to at least one sample data point in the series of sample data points to shorten $S_{TARGET}$ and lengthen $S_{1ST}$.

4. The method of claim 1, wherein reducing the interpolation error includes:
  determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
  determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);
  upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;
  upon determining that $ES_{1ST}$ is larger than $ES_{2ND}$, moving $P_{S+1}$ to shorten $S_{TARGET}$ and lengthen $S_{2ND}$; and
  upon determining that $ES_{2ND}$ is larger than $ES_{1ST}$, moving $P_S$ to shorten $S_{TARGET}$ and lengthen $S_{1ST}$.

5. A computer-implemented method of adjusting a series of N data points into best fit data points for a series of sample data points that form a data source such that a linear interpolation of the N data points closely approximates the series of sample data points, wherein the N data points require less storage in computer-readable memory and less computer processing bandwidth than the series of sample data points, the method comprising:
  identifying M segments having endpoints defined by adjacent subset data points, wherein M equals N−1; and
  performing an iterative process, including:
    determining a linear interpolation error for each of the M segments;
    identifying a segment from the M segments with a largest interpolation error and selecting the segment with the largest interpolation error as a target segment ($S_{TARGET}$);
    determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
    determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);
    upon determining that there is no $S_{1ST}$, moving $P_{S+1}$ by an increment corresponding to at least one sample data point in the series of sample data points to shorten $S_{TARGET}$ and lengthen $S_{2ND}$; and
    upon determining that there is no $S_{2ND}$, moving $P_S$ by an increment corresponding to at least one sample data point in the series of sample data points to shorten $S_{TARGET}$ and lengthen $S_{1ST}$.

6. The method of claim 5, wherein determining a linear interpolation error for each of the M segments includes quantifying a distance between the segment and the data source.

7. The method of claim 5, wherein:
  upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;
  upon determining that $ES_{1ST}$ is larger than $ES_{2ND}$, moving $P_{S+1}$ by an increment corresponding to at least one sample data point in the series of sample data points to shorten $S_{TARGET}$ and lengthen $S_{2ND}$; and
  upon determining that $ES_{2ND}$ is larger than $ES_{1ST}$, moving $P_S$ by an increment corresponding to at least one sample data point in the series of sample data points to shorten $S_{TARGET}$ and lengthen $S_{1ST}$.

8. A computer-implemented method of adjusting a series of N subset data points into best fit data points for a series of sample data points that form a data source such that a linear interpolation of the N subset data points closely approximates the series of sample data points, wherein the N subset data points require less storage in computer-readable memory and less computer processing bandwidth than the series of sample data points, the method comprising:
  identifying M segments having endpoints defined by adjacent subset data points, wherein M equals N−1; and
  performing an iterative process, including:
    determining a linear interpolation error for each of the M segments;
    identifying a segment from the M segments with a largest interpolation error and selecting the segment with the largest interpolation error as a target segment ($S_{TARGET}$); and
    determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
    determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);

upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;

upon determining that $ES_{1ST}$ is larger than $ES_{2ND}$, moving $P_{S+1}$ by an increment corresponding to at least one sample data point in the series of sample data points to shorten $S_{TARGET}$ and lengthen $S_{2ND}$; and upon determining that $ES_{2ND}$ is larger than $ES_{1ST}$, moving $P_S$ by an increment corresponding to at least one sample data point in the series of sample data points to shorten $S_{TARGET}$ and lengthen $S_{1ST}$.

9. The method of claim 8, wherein determining a linear interpolation error for each of the M segments includes quantifying a distance between the segment and the data source.

10. The method of claim 8, wherein:
upon determining that there is no $S_{1ST}$, moving $P_{S+1}$ by an increment corresponding to at least one sample data point in the series of sample data points to shorten $S_{TARGET}$ and lengthen $S_{2ND}$; and
upon determining that there is no $S_{2ND}$, moving $P_S$ by an increment corresponding to at least one sample data point in the series of sample data points to shorten $S_{TARGET}$ and lengthen $S_{1ST}$.

11. A computer-implemented method of adjusting a series of N subset data points into best fit data points for a series of sample data points that form a data source such that a linear interpolation of the N subset data points closely approximates the series of sample data points, wherein the N subset data points require less storage in computer-readable memory and less computer processing bandwidth than the series of sample data points, the method comprising:
identifying M segments having endpoints defined by adjacent subset data points, wherein M equals N−1; and
performing an iterative process, including:
determining a linear interpolation error for each of the M segments;
identifying a segment from the M segments with a largest interpolation error and selecting the segment with the largest interpolation error as a target segment ($S_{TARGET}$);
determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);
upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;
upon determining that $ES_{1ST}$ is larger than $ES_{2ND}$, moving $P_{S+1}$ by an increment corresponding to at least one sample data point in the series of sample data points to shorten $S_{TARGET}$ and lengthen $S_{2ND}$;
upon determining that $ES_{2ND}$ is larger than $ES_{1ST}$, moving $P_S$ by an increment corresponding to at least one sample data point in the series of sample data points to shorten $S_{TARGET}$ and lengthen $S_{1ST}$;
upon determining that there is no $S_{1ST}$, moving $P_{S+1}$ by an increment corresponding to at least one sample data point in the series of sample data points to shorten $S_{TARGET}$ and lengthen $S_{2ND}$; and
upon determining that there is no $S_{2ND}$, moving $P_S$ by an increment corresponding to at least one sample data point in the series of sample data points to shorten $S_{TARGET}$ and lengthen $S_{1ST}$.

12. The method of claim 11, wherein determining a linear interpolation error for each of the M segments includes quantifying a distance between the segment and the data source.

13. A computer-implemented method of reducing linear interpolation error for a data subset that contains a series of data points from a data source such that a linear interpolation of the data subset closely approximates the series of data points, wherein the data subset requires less storage in computer-readable memory and less computer processing bandwidth than the series of data points, the method comprising:
identifying interpolation errors for each segment defined by adjacent data points in the series of data points, and identifying the segment with a largest interpolation error as a target segment ($S_{TARGET}$) having endpoints defined by a first data point ($P_S$) and a second data point ($P_{S+1}$);
determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);
upon determining that there is no $S_{1ST}$, moving $P_{S+1}$ by an increment corresponding to at least one data point in the series of data points to shorten $S_{TARGET}$ and lengthen $S_{2ND}$; and
upon determining that there is no $S_{2ND}$, moving $P_S$ by an increment corresponding to at least one data point in the series of data points to shorten $S_{TARGET}$ and lengthen $S_{1ST}$.

14. The method of claim 13, further comprising:
upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;
upon determining that $ES_{1ST}$ is larger than $ES_{2ND}$, moving $P_{S+1}$ by an increment corresponding to at least one data point in the series of data points to shorten $S_{TARGET}$ and lengthen $S_{2ND}$; and
upon determining that $ES_{2ND}$ is larger than $ES_{1ST}$, moving $P_S$ by an increment corresponding to at least one data point in the series of data points to shorten $S_{TARGET}$ and lengthen $S_{1ST}$.

15. The method of claim 14, further comprising:
determining whether a moved data point is $P_S$ or $P_{S+1}$;
determining whether the moved data point is oscillating between positions for successive iterations; and
upon determining that the moved data point is oscillating between positions, identifying a new target segment that has the next largest linear interpolation error.

16. The method of claim 15, wherein determining whether the moved data point is oscillating between positions includes:
recording the moved data point, the direction of motion for the moved data point, and the resulting interpolation error for the target segment ($ES_{TARGET}$);
determining whether the moved data points are the same point for successive iterations;

upon determining that the last data points moved are the same point, determining whether the last two movements of the same data point are in opposite directions; and upon determining that the last two movements of the same data point are in opposite directions,
declaring that the moved data point is oscillating between positions, and
selecting the data point position that results in the smallest sum of a first $ES_{TARGET}$ for a first $S_{TARGET}$ and a second $ES_{TARGET}$ for a second $S_{TARGET}$ that is adjacent to the first $S_{TARGET}$ and follows the first $S_{TARGET}$ in a successive iteration.

17. The method of claim 13, wherein the source data is a series of sample points, and wherein moving $P_{S+1}$ includes decrementing $P_{S+1}$ along the series of source data sample points by at least one source data sample point, and moving $P_S$ includes incrementing $P_S$ along the series of source data sample points by at least one source data sample point.

18. The method of claim 17, wherein the at least one source data sample point is a programmable interval.

19. The method of claim 17, wherein the at least one source data sample point is one source data sample point.

20. The method of claim 13, wherein moving $P_{S+1}$ includes moving an X value for $P_{S+1}$ ($X(P_{S+1})$) by a predetermined $\Delta X$ and moving $P_S$ includes moving an X value for $P_S$ ($X(P_S)$) by the predetermined $\Delta X$.

21. The method of claim 20, wherein the predetermined $\Delta X$ is programmable.

22. The method of claim 13, wherein moving $P_{S+1}$ includes moving a Y value for $P_{S+1}$ ($Y(P_{S+1})$) by a predetermined $\Delta Y$ and moving $P_S$ includes moving a Y value for $P_S$ ($Y(P_S)$) by the predetermined $\Delta Y$.

23. The method of claim 22, wherein the predetermined $\Delta Y$ is programmable.

24. A computer-implemented method of reducing linear interpolation error for a data subset that contains a series of data points from a source data such that a linear interpolation of the data subset closely approximates the series of data points, wherein the data subset requires less storage in computer-readable memory and less computer processing bandwidth than the series of data points, the method comprising:

identifying interpolation errors for each segment defined by adjacent data points in the series of data points, and identifying a segment with a largest interpolation error as a target segment ($S_{TARGET}$) having endpoints defined by a first data point ($P_S$) and a second data point ($P_{S+1}$);

determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);

determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);

upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;

upon determining that $ES_{1ST}$ is larger than $ES_{2ND}$, moving $P_{S+1}$ by an increment corresponding to at least one data point in the series of data points to shorten $S_{TARGET}$ and lengthen $S_{2ND}$; and upon determining that $ES_{2ND}$ is larger than $ES_{1ST}$, moving $P_S$ by an increment corresponding to at least one data point in the series of data points to shorten $S_{TARGET}$ and lengthen $S_{1ST}$.

25. The method of claim 24, further comprising:
upon determining that there is no $S_{1ST}$, moving $P_{S+1}$ by an increment corresponding to at least one data point in the series of data points to shorten $S_{TARGET}$ and lengthen $S_{2ND}$; and
upon determining that there is no $S_{2ND}$, moving $P_S$ by an increment corresponding to at least one data point in the series of data points to shorten $S_{TARGET}$ and lengthen $S_{1ST}$.

26. The method of claim 25, further comprising:
determining whether a moved data point is $P_S$ or $P_{S+1}$;
determining whether the moved data point is oscillating between positions for successive iterations; and
upon determining that the moved data point is oscillating between positions for successive iterations, identifying a new target segment that has the next largest linear interpolation error.

27. The method of claim 26, wherein determining whether the moved data point is oscillating between positions for successive iterations includes:
recording the moved data point, the direction of motion for the moved data point, and the resulting interpolation error for the target segment ($ES_{TARGET}$);
determining whether the moved data points are the same point for successive iterations;
upon determining that the moved data points are the same point for successive iterations, determining whether the last two movements of the same data point are in opposite directions; and
upon determining that the last two movements of the same data point are in opposite directions,
declaring that the moved data point is oscillating between positions, and
selecting the data point position that results in the smallest sum of a first $ES_{TARGET}$ for a first $S_{TARGET}$ and a second $ES_{TARGET}$ for a second $S_{TARGET}$ that is adjacent to the first $S_{TARGET}$ and follows the first $S_{TARGET}$ in a successive iteration.

28. The method of claim 24, wherein the source data is a series of sample points, and wherein moving $P_{S+1}$ includes decrementing $P_{S+1}$ along the series of sample points by at least one sample point, and moving $P_S$ includes incrementing $P_S$ along the series of sample points by at least one sample point.

29. The method of claim 28, wherein the at least one sample point is a programmable interval.

30. The method of claim 28, wherein the at least one sample point is one sample point.

31. The method of claim 24, wherein moving $P_{S+1}$ includes moving an X value for $P_{S+1}$ ($X(P_{S+1})$) by a predetermined $\Delta X$ and moving $P_S$ includes moving an X value for $P_S$ ($X(P_S)$) by the predetermined $\Delta X$.

32. The method of claim 31, wherein the predetermined $\Delta X$ is programmable.

33. The method of claim 24, wherein moving $P_{S+1}$ includes moving a Y value for $P_{S+1}$ ($Y(P_{S+1})$) by a predetermined $\Delta Y$ and moving $P_S$ includes moving a Y value for $P_S$ ($Y(P_S)$) by the predetermined $\Delta Y$.

34. The method of claim 31, wherein the predetermined $\Delta Y$ is programmable.

35. A computer-implemented method of reducing linear interpolation error for a data subset that contains a series of data points from a source data such that a linear interpolation of the data subset closely approximates the series of data points, wherein the data subset requires less storage in computer-readable memory and less computer processing bandwidth than the series of data points, the method comprising:

identifying interpolation errors for each segment defined by adjacent data points in the series of data points, and identifying a segment with a largest interpolation error as a target segment ($S_{TARGET}$) having endpoints defined by a first data point ($P_S$) and a second data point ($P_{S+1}$);

determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);

determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);

upon determining that there is no $S_{1ST}$, moving $P_{S+1}$ by an increment corresponding to at least one data point in the series of data points to shorten $S_{TARGET}$ and lengthen $S_{2ND}$;

upon determining that there is no $S_{2ND}$, moving $P_S$ by an increment corresponding to at least one data point in the series of data points to shorten $S_{TARGET}$ and lengthen $S_{1ST}$;

upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;

upon determining that $ES_{1ST}$ is larger than $ES_{2ND}$, moving $P_{S+1}$ by an increment corresponding to at least one data point in the series of data points to shorten $S_{TARGET}$ and lengthen $S_{2ND}$; and upon determining that $ES_{2ND}$ is larger than $ES_{1ST}$, moving $P_S$ by an increment corresponding to at least one data point in the series of data points to shorten $S_{TARGET}$ and lengthen $S_{1ST}$.

36. The method of claim 35, further comprising:

determining whether a moved data point is $P_S$ or $P_{S+1}$;

determining whether the moved data point is oscillating between positions for successive iterations; and upon determining that the moved data point is oscillating between positions for successive iterations, identifying a new target segment that has the next largest linear interpolation error.

37. The method of claim 35, wherein the source data is a series of sample points, and wherein moving $P_{S+1}$ includes decrementing $P_{S+1}$ along the series of source data sample points by at least one source data sample point, and moving $P_S$ includes incrementing $P_S$ along the series of source data sample points by at least one source data sample point.

38. The method of claim 35, wherein moving $P_{S+1}$ includes moving an X value for $P_{S+1}$ ($X(P_{S+1})$) by a predetermined $\Delta X$ and moving $P_S$ includes moving an X value for $P_S$ ($X(P_S)$) by the predetermined $\Delta X$.

39. The method of claim 35, wherein moving $P_{S+1}$ includes moving a Y value for $P_{S+1}$ ($Y(P_{S+1})$) by a predetermined $\Delta Y$ and moving $P_S$ includes moving a Y value for $P_S$ ($Y(P_S)$) by the predetermined $\Delta Y$.

40. A computer-implemented method of reducing linear interpolation error for a data subset that contains a plurality of data points from source data such that a linear interpolation of the data subset closely approximates the series of data points, wherein the data subset requires less storage in computer-readable memory and less computer processing bandwidth than the series of data points, wherein the data points from the source data are sequenced from left to right, the method comprising:

identifying interpolation errors for each segment defined by adjacent data points in the series of data points, and identifying a segment with a largest interpolation error as a target segment ($S_{TARGET}$) having endpoints defined by a left data point ($P_L$) and a right data point ($P_R$);

determining whether there is a left segment ($S_{LEFT}$) with respect to $S_{TARGET}$ having endpoints defined by a left data point ($P_L-1$) and a right data point ($P_L$);

determining whether there is a right segment ($S_{RIGHT}$) with respect to $S_{TARGET}$ having endpoints defined by a left data point ($P_R$) and a right data point ($P_R+1$);

upon determining that there is no $S_{LEFT}$, shortening $S_{TARGET}$ by moving $P_R$ left by an increment corresponding to at least one data point in the series of data points;

upon determining that there is no $S_{RIGHT}$, shortening $S_{TARGET}$ by moving $P_L$ right by an increment corresponding to at least one data point in the series of data points;

upon determining that there is a $S_{LEFT}$ and a $S_{RIGHT}$, determining whether an interpolation error for $S_{LEFT}$ ($ES_{LEFT}$) or an interpolation error for $S_{RIGHT}$ ($ES_{RIGHT}$) is larger;

upon determining that $ES_{LEFT}$ is larger than $ES_{RIGHT}$, moving $P_R$ left by an increment corresponding to at least one data point in the series of data points to shorten $S_{TARGET}$ and lengthen $S_{RIGHT}$; and upon determining that $ES_{RIGHT}$ is larger than $ES_{LEFT}$, moving $P_L$ right by an increment corresponding to at least one data point in the series of data points to shorten $S_{TARGET}$ and lengthen $S_{LEFT}$.

41. The method of claim 40, further comprising:

determining whether a moved data point is $P_L$ or $P_R$;

determining whether the moved data point is oscillating between positions for successive iterations; and upon determining that the moved data point is oscillating between positions for successive iterations, identifying a new target segment that has the next largest linear interpolation error.

42. The method of claim 41, wherein determining whether the moved data point is oscillating between positions includes:

recording the moved data point, the direction of motion for the moved data point, and the resulting interpolation error for the target segment ($ES_{TARGET}$);

determining whether the moved data points are the same point for successive iterations;

upon determining that the moved data points are the same point for successive iterations, determining whether the last two movements of the same data point are in opposite directions; and upon determining that the last two movements of the same data point are in opposite directions, declaring that the moved data point is oscillating between positions, and selecting the data point position that results in the smallest sum of a first $ES_{TARGET}$ for a first $S_{TARGET}$ and a second $ES_{TARGET}$ for a second $S_{TARGET}$ that is adjacent to the first $S_{TARGET}$ and follows the first $S_{TARGET}$ in a successive iteration.

43. The method of claim 40, wherein the source data is a series of sample points, and wherein moving $P_{S+1}$ includes decrementing $P_{S+1}$ along the series of sample points by at least one sample point, and moving $P_S$ includes incrementing $P_S$ along the series of sample points by at least one sample point.

44. The method of claim 40, wherein moving $P_R$ left includes decrementing $X(P_R)$ by a predetermined $\Delta X$ and moving $P_L$ right includes incrementing $X(P_L)$ by the predetermined $\Delta X$.

45. A computer-implemented method of selecting best fit data points for a series of sample data points that form source data such that a linear interpolation of the best fit data points closely approximates the series of data points, wherein the best fit data points require less storage in computer-readable memory and less computer processing bandwidth than the series of data points, the method comprising:
- seeding a series of N data points on the source data; and
- performing an iterative process, including:
  - determining linear interpolation errors between the N data points and the source data for M segments that are capable of being formed between adjacent data points, wherein M equals N−1;
  - sorting the M segments based on linear interpolation error size;
  - identifying a segment from the M segments with a largest interpolation error, and identifying the segment with the largest interpolation error as a target segment ($S_{TARGET}$); and
  - reducing the linear interpolation error for $S_{TARGET}$ by moving one endpoint of $S_{TARGET}$ by an increment corresponding to at least one sample data point in the series of sample data points to shorten $S_{TARGET}$.

46. The method of claim 45, wherein seeding a series of N data points on the source data includes:
- identifying a number N corresponding to a number of data points in a data subset; and
- dividing an axis range of the source data into M segments.

47. The method of claim 46, wherein dividing an axis range of the source data into M segments includes dividing an axis range of the source data into M segments of equal length.

48. The method of claim 45, wherein determining linear interpolation errors between the N data points and the source data for M segments that are capable of being formed between adjacent data points includes:
- identifying a first endpoint and a second endpoint for each of the M segments;
- identifying incremental values extending from the first endpoint and to the second endpoint for each of the M segments;
- quantifying a difference between the interpolated data and the source data for each of the incremental values; and
- identifying the linear interpolation error (ES) for each of the M segments by selecting the largest difference obtained for the incremental values.

49. The method of claim 48, wherein the source data is a series of data samples, and wherein identifying incremental values extending from the first endpoint and to the second endpoint for each of the M segments includes identifying incremental values that are an increment of at least one data sample.

50. The method of claim 48, wherein identifying incremental values extending from the first endpoint and to the second endpoint for each of the M segments includes identifying X axis incremental values, and wherein quantifying a difference between the interpolated data and the source data for each of the incremental values the data includes quantifying a difference in Y axis values for each of the X axis incremental values.

51. The method of claim 48, wherein identifying incremental values extending from the first endpoint and to the second endpoint for each of the M segments includes identifying Y axis incremental values, and wherein quantifying a difference between the interpolated data and the source data for each of the incremental values the data includes quantifying a difference in X axis values for each of the Y axis incremental values.

52. The method of claim 45, wherein determining linear interpolation errors between the N data points and the source data for M segments that are capable of being formed between adjacent data points includes the following for each segment S:
- identifying a first endpoint $P_1$ and a second endpoint $P_2$ for segment S, wherein $P_1$ has an X value $X(P_1)$ and a Y value $Y(P_1)$, and $P_2$ has an X value $X(P_2)$ and a Y value $Y(P_2)$;
- setting an increment variable (I) equal to $X(P_1)$;
- calculating a linear interpolation error value corresponding to the X value in the variable I that is equal to the absolute value of the Y value for the source data less the Y value for the segment ($|Y(DATA)_I - Y(SEG)_I|$);
- recording the I and the corresponding linear interpolation error value;
- determining whether I equals $X(P_2)$; and
- upon determining that I does not equal $X(P_2)$, incrementing I by a predetermined $\Delta X$ and calculating a linear interpolation error value for the newly incremented I.

53. The method of claim 45, wherein determining linear interpolation errors between the N data points and the source data for M segments that are capable of being formed between adjacent data points includes the following for each segment S:
- identifying a first endpoint $P_1$ and a second endpoint $P_2$ for segment S, wherein $P_1$ has an X value $X(P_1)$ and a Y value $Y(P_1)$, and $P_2$ has an X value $X(P_2)$ and a Y value $Y(P_2)$;
- setting an increment variable (I) equal to $Y(P_1)$;
- calculating a linear interpolation error value corresponding to the Y value in the variable I that is equal to the absolute value of the X value for the source data less the X value for the segment ($|X(DATA)_I - X(SEG)_I|$);
- recording the I and the corresponding linear interpolation error value;
- determining whether I equals $Y(P_2)$; and
- upon determining that I does not equal $Y(P_2)$, incrementing I by a predetermined $\Delta Y$ and calculating a linear interpolation error value for the newly incremented I.

54. The method of claim 45, wherein sorting the M segments based on linear interpolation error size includes sorting the M segments in order of decreasing interpolation error size from $S_{E(MAX)}$ to $S_{E(MIN)}$.

55. The method of claim 45, further comprising checking for termination, including:
- calculating a total interpolation error for the source data;
- determining whether the total interpolation error changes;
- upon determining that the total interpolation error does not change, incrementing a counter;
- determining whether the counter equals a termination value; and
- upon determining that the counter equals a termination value, terminating the calculation process and extracting the data points.

56. A computer-implemented method of selecting best fit data points for a data subset of a sequence of sample data points that form source data such that a linear interpolation of the data subset closely approximates the series of data points, wherein the data subset requires less storage in computer-readable memory and less computer processing bandwidth than the series of data points, the method comprising:

seeding a series of N data points on the source data;

determining linear interpolation errors between the N data points and the source data for M segments that are capable of being formed between adjacent data points, wherein M equals N−1;

sorting the M segments based on linear interpolation error size;

identifying a segment from the M segments with a largest interpolation error, and identifying the segment with the largest interpolation error as a target segment ($S_{TARGET}$); and reducing the linear interpolation error for $S_{TARGET}$, including:

determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);

determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);

upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;

upon determining that $ES_{1ST}$ is larger than $ES_{2ND}$, moving $P_{S+1}$ by an increment corresponding to at least one data point in the sequence of sample data points to shorten $S_{TARGET}$ and lengthen $S_{2ND}$; and upon determining that $ES_{2ND}$ is larger than $ES_{1ST}$, moving $P_S$ by an increment corresponding to at least one data point in the sequence of sample data points to shorten $S_{TARGET}$ and lengthen $S_{1ST}$.

57. The method of claim 56, further comprising:

upon determining that there is no $S_{1ST}$, moving $P_{S+1}$ by an increment corresponding to at least one data point in the sequence of sample data points to shorten $S_{TARGET}$ and lengthen $S_{2ND}$; and upon determining that there is no $S_{2ND}$, moving $P_S$ by an increment corresponding to at least one data point in the sequence of sample data points to shorten $S_{TARGET}$ and lengthen $S_{1ST}$.

58. The method of claim 57, further comprising:

determining whether a moved data point is $P_S$ or $P_{S+1}$;

determining whether the moved data point is oscillating between positions for successive iterations; and upon determining that the moved data point is oscillating between positions for successive iterations, identifying a new target segment that has the next largest linear interpolation error.

59. The method of claim 58, wherein determining whether the moved data point is oscillating between positions for successive iterations includes:

recording the moved data point, the direction of motion for the moved data point, and the resulting interpolation error for the target segment ($ES_{TARGET}$);

determining whether the moved data points are the same point for successive iterations;

upon determining that the moved data points are the same point for successive iterations, determining whether the last two movements of the same data point are in opposite directions; and upon determining that the last two movements of the same data point are in opposite directions, declaring that the moved data point is oscillating between positions, and selecting the data point position that results in the smallest sum of a first $ES_{TARGET}$ for a first $S_{TARGET}$ and a second $ES_{TARGET}$ for a second $S_{TARGET}$ that is adjacent to the first $S_{TARGET}$ and follows the first $S_{TARGET}$ in a successive iteration.

60. The method of claim 56, wherein the source data is a series of sample points, and moving $P_{S+1}$ includes decrementing $P_{S+1}$ along the series of sample points by at least one sample point, and moving $P_S$ includes incrementing $P_S$ along the series of sample points by at least one sample point.

61. The method of claim 56, wherein moving $P_{S+1}$ includes moving an X value for $P_{S+1}$ ($X(P_{S+1})$) by a predetermined $\Delta X$ and moving $P_S$ includes moving an X value for $P_S$ ($X(P_S)$) by the predetermined $\Delta X$.

62. The method of claim 56, wherein moving $P_{S+1}$ includes moving a Y value for $P_{S+1}$ ($Y(P_{S+1})$) by a predetermined $\Delta Y$ and moving $P_S$ includes moving a Y value for $P_S$ ($Y(P_S)$) by the predetermined $\Delta Y$.

63. A computer-implemented method of selecting best fit data points from a sequence of sample data points that form source data such that a linear interpolation of the best fit data points closely approximates the series of data points, wherein the best fit data points require less storage in computer-readable memory and less computer processing bandwidth than the series of data points, the method comprising:

seeding a series of N data points on the source data;

determining linear interpolation errors between the N data points and the source data for M segments that are capable of being formed between adjacent data points, wherein M equals N−1;

sorting the M segments based on linear interpolation error size;

identifying a segment from the M segments with a largest interpolation error, and identifying the segment with the largest interpolation error as a target segment ($S_{TARGET}$); and reducing the linear interpolation error for $S_{TARGET}$, including:

determining whether there is a left segment ($S_{LEFT}$) with respect to $S_{TARGET}$ having endpoints defined by a left data point ($P_L-1$) and a right data point ($P_L$);

determining whether there is a right segment ($S_{RIGHT}$) with respect to $S_{TARGET}$ having endpoints defined by a left data point ($P_R$) and a right data point ($P_R+1$);

upon determining that there is no $S_{LEFT}$, shortening $S_{TARGET}$ by moving $P_R$ left by an increment corresponding to at least one data point in the sequence of sample data points;

upon determining that there is no $S_{RIGHT}$, shortening $S_{TARGET}$ by moving $P_L$ right by an increment corresponding to at least one data point in the sequence of sample data points;

upon determining that there is a $S_{LEFT}$ and a $S_{RIGHT}$, determining whether an interpolation error for $S_{LEFT}$ ($ES_{LEFT}$) or an interpolation error for $S_{RIGHT}$ ($ES_{RIGHT}$) is larger;

upon determining that $ES_{LEFT}$ is larger than $ES_{RIGHT}$, moving $P_R$ left by an increment corresponding to at least one data point in the sequence of sample data points to shorten $S_{TARGET}$ and lengthen $S_{RIGHT}$; and upon determining that $ES_{RIGHT}$ is larger than $ES_{LEFT}$, moving $P_L$ right by an increment corresponding to at least one data point in the sequence of sample data points to shorten $S_{TARGET}$ and lengthen $S_{LEFT}$.

64. The method of claim 63, further comprising:
determining whether a moved data point is $P_L$ or $P_R$;
determining whether the moved data point is oscillating between positions for successive iterations; and
upon determining that the moved data point is oscillating between positions for successive iterations, identifying a new target segment that has the next largest linear interpolation error.

65. The method of claim 64, wherein determining whether the moved data point is oscillating between positions includes:
recording the moved data point, the direction of motion for the moved data point, and the resulting interpolation error for the target segment ($ES_{TARGET}$);
determining whether the moved data points are the same point for successive iterations;
upon determining that the moved data points are the same point for successive iterations, determining whether the last two movements of the same data point are in opposite directions; and
upon determining that the last two movements of the same data point are in opposite directions,
declaring that the moved data point is oscillating between positions, and
selecting the data point position that results in the smallest sum of a first $ES_{TARGET}$ for a first $S_{TARGET}$ and a second $ES_{TARGET}$ for a second $S_{TARGET}$ that is adjacent to the first $S_{TARGET}$ and follows the first $S_{TARGET}$ in a successive iteration.

66. The method of claim 63, wherein moving $P_R$ left includes moving $X(P_R)$ by a predetermined $\Delta X$ and moving $P_L$ right includes moving $X(P_L)$ by the predetermined $\Delta X$.

67. A computer-implemented method of reducing a series of characterization data points from a characterization source data into a data subset for a model table by selecting best fit data points to reduce the linear interpolation error in a simulation model such that a linear interpolation of the data subset closely approximates the series of characterization data points, wherein the data subset requires less storage in computer-readable memory and less computer processing bandwidth than the series of characterization data points, the method comprising:
seeding a series of N data points on the characterization source data;
identifying M segments having endpoints defined by adjacent data points, wherein M equals N−1;
determining a linear interpolation error for each of the M segments;
identifying a segment from the M segments with a largest interpolation error and selecting a segment with the largest interpolation error as a target segment ($S_{TARGET}$); and
reducing the interpolation error for $S_{TARGET}$ by moving one endpoint of $S_{TARGET}$ by an increment corresponding to at least one data point in the series of characterization data points to shorten $S_{TARGET}$.

68. The method of claim 67, wherein determining a linear interpolation error for each of the M segments includes quantifying a distance between the segment and the data source.

69. The method of claim 67, wherein reducing the interpolation error for $S_{TARGET}$ includes:
determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);
upon determining that there is no $S_{1ST}$, moving $P_{S+1}$ to shorten $S_{TARGET}$ and lengthen $S_{2ND}$ by an increment corresponding to at least one data point in the series of characterization data points; and
upon determining that there is no $S_{2ND}$, moving $P_S$ to shorten $S_{TARGET}$ and lengthen $S_{1ST}$ by an increment corresponding to at least one data point in the series of characterization data points.

70. The method of claim 67, wherein reducing the interpolation error for $S_{TARGET}$ includes:
determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);
upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;
upon determining that $ES_{1ST}$ is larger than $ES_{2ND}$, moving $P_{S+1}$ by an increment corresponding to at least one data point in the series of characterization data points to shorten $S_{TARGET}$ and lengthen $S_{2ND}$; and
upon determining that $ES_{2ND}$ is larger than $ES_{1ST}$, moving $P_S$ by an increment corresponding to at least one data point in the series of characterization data points to shorten $S_{TARGET}$ and lengthen $S_{1ST}$.

71. A computer-implemented method of reducing a series of characterization data points from a characterization source data into a data subset for a model table by selecting best fit data points to reduce the linear interpolation error in a simulation model such that a linear interpolation of the data subset closely approximates the series of characterization data points, wherein the data subset requires less storage in computer-readable memory and less computer processing bandwidth than the series of characterization data points, the method comprising:
seeding a series of N data points on the characterization source data;
identifying M segments having endpoints defined by adjacent subset data points, wherein M equals N−1; and
performing an iterative process, including:
determining a linear interpolation error for each of the M segments;
identifying a segment from the M segments with a largest interpolation error and selecting the segment with the largest interpolation error as a target segment ($S_{TARGET}$);
determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);

upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;

upon determining that $ES_{1ST}$ is larger than $ES_{2ND}$, moving $P_{S+1}$ to shorten $S_{TARGET}$ and lengthen $S_{2ND}$ by an increment corresponding to at least one data point in the series of characterization data points; and upon determining that $ES_{2ND}$ is larger than $ES_{1ST}$, moving $P_S$ to shorten $S_{TARGET}$ and lengthen $S_{1ST}$ by an increment corresponding to at least one data point in the series of characterization data points.

72. The method of claim 71, wherein determining a linear interpolation error for each of the M segments includes quantifying a distance between the segment and the data source.

73. A method of reducing a series of characterization data points from characterization source data into a data subset for a model table by selecting best fit data points to reduce the linear interpolation error in a simulation model, comprising:

seeding a series of N data points on the characterization source data;

performing an iterative process to identify best fit data points, including:
  determining linear interpolation errors between the N data points and the source data for M segments that are capable of being formed between adjacent data points, wherein M equals N−1;
  sorting the M segments based on linear interpolation error size;
  identifying a target segment ($S_{TARGET}$) from the M segments, including identifying a segment that has endpoints defined by two adjacent data points and that has the largest interpolation error; and
  reducing the linear interpolation error for $S_{TARGET}$, including:
    determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
    determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);
    upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;
    upon determining that $ES_{1ST}$ is larger than $ES_{2ND}$, moving $P_{S+1}$ to shorten $S_{TARGET}$ and lengthen $S_{2ND}$ by an increment corresponding to at least one data point in the series of characterization data points; and
    upon determining that $ES_{2ND}$ is larger than $ES_{1ST}$, moving $P_S$ by an increment corresponding to at least one data point in the series of characterization data points to shorten $S_{TARGET}$ and lengthen $S_{1ST}$;
extracting the best fit data points upon completion of the iterative process; and
incorporating the best fit data points as the data subset for the model table.

74. The method of claim 73, further comprising:
upon determining that there is no $S_{1ST}$, moving $P_{S+1}$ by an increment corresponding to at least one data point in the series of characterization data points to shorten $S_{TARGET}$ and lengthen $S_{2ND}$; and
upon determining that there is no $S_{2ND}$, moving $P_S$ by an increment corresponding to at least one data point in the series of characterization data points to shorten $S_{TARGET}$ and lengthen $S_{1ST}$.

75. A method of forming simulation model tables, comprising:
retrieving source data from cell libraries, the source data including a series of sample data points;
compressing the source data into subsets of best fit data points, including:
  identifying M segments having endpoints defined by adjacent subset data points, wherein M equals N−1; and
  performing an iterative process, including:
    determining a linear interpolation error for each of the M segments;
    identifying a segment from the M segments with a largest interpolation error and selecting the segment with the largest interpolation error as a target segment ($S_{TARGET}$); and reducing the interpolation error for $S_{TARGET}$ by moving one endpoint of $S_{TARGET}$ by an increment of at least one sample point in the series of sample data points to shorten $S_{TARGET}$; and
incorporating the subsets into simulation model tables.

76. The method of claim 75, wherein determining a linear interpolation error for each of the M segments includes quantifying a distance between the segment and the data source.

77. The method of claim 75, wherein reducing the interpolation error for $S_{TARGET}$ includes:
determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);
upon determining that there is no $S_{1ST}$, moving $P_{S+1}$ by an increment corresponding to at least one sample data point in the series of sample data points to shorten $S_{TARGET}$ and lengthen $S_{2ND}$; and
upon determining that there is no $S_{2ND}$, moving $P_S$ by an increment corresponding to at least one sample data point in the series of sample data points to shorten $S_{TARGET}$ and lengthen $S_{1ST}$.

78. The method of claim 75, wherein reducing the interpolation error includes:
determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);
upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;
upon determining that $ES_{1ST}$ is larger than $ES_{2ND}$, moving $P_{S+1}$ by an increment corresponding to at least one sample data point in the series of sample data points to shorten $S_{TARGET}$ and lengthen $S_{2ND}$; and upon determining that $ES_{2ND}$ is larger than $ES_{1ST}$, moving $P_S$ by an increment corresponding to at least one sample data point in the series of sample data points to shorten $S_{TARGET}$ and lengthen $S_{1ST}$.

79. A method of forming simulation model tables, comprising:
retrieving source data from cell libraries, the source data including a series of sample data points;
compressing the source data into subsets of best fit data points, including:
identifying M segments having endpoints defined by adjacent subset data points, wherein M equals N−1; and
performing an iterative process, including:
determining a linear interpolation error for each of the M segments;
identifying a segment from the M segments with a largest interpolation error and selecting the segment with the largest interpolation error as a target segment ($S_{TARGET}$);
determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);
upon determining that there is no $S_{1ST}$, moving $P_{S+1}$ by an increment corresponding to at least one sample data point in the series of sample data points to shorten $S_{TARGET}$ and lengthen $S_{2ND}$; and
upon determining that there is no $S_{2ND}$, moving $P_S$ by an increment corresponding to at least one sample data point in the series of sample data points to shorten $S_{TARGET}$ and lengthen $S_{1ST}$; and
incorporating the subsets in to simulation model tables.

80. The method of claim 79, wherein determining a linear interpolation error for each of the M segments includes quantifying a distance between the segment and the data source.

81. The method of claim 79, wherein:
upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;
upon determining that $ES_{1ST}$ is larger than $ES_{2ND}$, moving $P_{S+1}$ to shorten $S_{TARGET}$ and lengthen $S_{2ND}$; and
upon determining that $ES_{2ND}$ is larger than $ES_{1ST}$, moving $P_S$ to shorten $S_{TARGET}$ and lengthen $S_{1ST}$.

82. A method of forming simulation model tables, comprising:
retrieving source data from cell libraries, the source data including a series of sample data points;
compressing the source data into subsets of best fit data points, including:
identifying M segments having endpoints defined by adjacent subset data points, wherein M equals N−1; and
performing an iterative process, including:
determining a linear interpolation error for each of the M segments;
identifying a segment from the M segments with a largest interpolation error and selecting the segment with the largest interpolation error as a target segment ($S_{TARGET}$); and
determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);
upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;
upon determining that $ES_{1ST}$ is larger than $ES_{2ND}$, moving $P_{S+1}$ by an increment corresponding to at least one sample data point in the series of sample data points to shorten $S_{TARGET}$ and lengthen $S_{2ND}$; and
upon determining that $ES_{2ND}$ is larger than $ES_{1ST}$, moving $P_S$ by an increment corresponding to at least one sample data point in the series of sample data points to shorten $S_{TARGET}$ and lengthen $S_{1ST}$; and
incorporating the subsets in to simulation model tables.

83. The method of claim 82, wherein determining a linear interpolation error for each of the M segments includes quantifying a distance between the segment and the data source.

84. The method of claim 82, wherein:
upon determining that there is no $S_{1ST}$, moving $P_{S+1}$ to shorten $S_{TARGET}$ and lengthen $S_{2ND}$; and
upon determining that there is no $S_{2ND}$, moving $P_S$ to shorten $S_{TARGET}$ and lengthen $S_{1ST}$.

85. A computer-implemented method of forming simulation model tables, comprising:
retrieving source data from cell libraries, the source data including a series of sample data points;
compressing the source data into subsets of best fit data points such that a linear interpolation of the subsets of best fit data points closely approximates the series of sample data points and such that the subsets of best fit data points require less storage in computer memory and less computer processing bandwidth than the series of sample data points, including:
identifying M segments having endpoints defined by adjacent subset data points, wherein M equals N−1; and
performing an iterative process, including:
determining a linear interpolation error for each of the M segments;
identifying a segment from the M segments with a largest interpolation error and selecting the segment with the largest interpolation error as a target segment ($S_{TARGET}$);
determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);
upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;

upon determining that $ES_{1ST}$ is larger than $ES_{2ND}$, moving $P_{S+1}$ by an increment corresponding to at least one sample data point in the series of sample data points to shorten $S_{TARGET}$ and lengthen $S_{2ND}$;

upon determining that $ES_{2ND}$ is larger than $ES_{1ST}$, moving $P_S$ by an increment corresponding to at least one sample data point in the series of sample data points to shorten $S_{TARGET}$ and lengthen $S_{1ST}$;

upon determining that there is no $S_{1ST}$, moving $P_{S+1}$ by an increment corresponding to at least one sample data point in the series of sample data points to shorten $S_{TARGET}$ and lengthen $S_{2ND}$; and upon determining that there is no $S_{2ND}$, moving $P_S$ by an increment corresponding to at least one sample data point in the series of sample data points to shorten $S_{TARGET}$ and lengthen $S_{1ST}$.

86. The method of claim 85, wherein determining a linear interpolation error for each of the M segments includes quantifying a distance between the segment and the data source.

87. A method of designing a circuit, comprising:
providing libraries of source data, the source data including a series of sample data points;
compressing the libraries into subsets of best fit data points for simulation model tables, including:
retrieving source data from cell libraries;
compressing the source data into subsets of best fit data points, including:
identifying M segments having endpoints defined by adjacent subset data points, wherein M equals N−1; and
performing an iterative process that includes determining a linear interpolation error for each of the M segments, identifying a segment from the M segments with a largest interpolation error and selecting the segment with the largest interpolation error as a target segment ($S_{TARGET}$); and
reducing the interpolation error for $S_{TARGET}$ by an increment corresponding to at least one sample data point in the series of sample data points; and
incorporating subsets into simulation model tables; and
designing a high level circuit using the simulation model tables.

88. The method of claim 87, further comprising fabricating a physical circuit upon completing the design of the high level circuit.

89. The method of claim 87, wherein providing libraries of source data includes:
simulating electronics at device and cell levels to collect simulation results; and
converting simulation results into libraries of source data.

90. The method of claim 87, wherein designing high level circuits using the simulation models includes:
building higher level circuit using model tables;
simulating the higher level circuit;
determining whether the circuit requires a design modification; and
upon determining that the circuit requires a design modification, modifying the circuit and simulating the modified circuit.

91. A system, comprising:
a processor;
computer readable medium coupled to the processor, wherein the computer readable medium is encoded with a computer program that causes the processor to reduce linear interpolation error between a series of data points in a data subset and source data, the source data including a series of sample data points, wherein the computer readable medium includes:

programming code for identifying segments between adjacent data points in the series of sample data points, identifying a segment with a largest interpolation error, and identifying the segment with the largest interpolation error as a target segment ($S_{TARGET}$) having endpoints defined by a first data point ($P_S$) and a right data point ($P_{S+1}$);

programming code for determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);

programming code for determining whether there is a second adjacent segment ($S_{2ND}$) having a common endpoint with $S_{TARGET}$ such that $S_{2ND}$ has endpoints defined by a first data point ($P_{S-1}$) and a second data point ($P_{S+2}$);

programming code for, upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;

programming code for, upon determining that $ES_{1ST}$ is larger than $ES_{2ND}$, moving $P_{S+1}$ by an increment corresponding to at least one sample data point in the series of sample data points to shorten $S_{TARGET}$ and lengthen $S_{2ND}$; and programming code for, upon determining that $ES_{2ND}$ is larger than $ES_{1ST}$, moving $P_S$ by an increment corresponding to at least one sample data point in the series of sample data points to shorten $S_{TARGET}$ and lengthen $S_{1ST}$.

92. The system of claim 91, further comprising:
programming code for, upon determining that there is no $S_{1ST}$, moving $P_{S+1}$ by an increment corresponding to at least one sample data point in the series of sample data points to shorten $S_{TARGET}$ and lengthen $S_{2ND}$, and
programming code for, upon determining that there is no $S_{2ND}$, moving $P_S$ by an increment corresponding to at least one sample data point in the series of sample data points to shorten $S_{TARGET}$ and lengthen $S_{1ST}$.

93. The system of claim 92, further comprising:
programming code for determining whether a moved data point is $P_S$ or $P_{S+1}$;
programming code for determining whether the move data point is oscillating between positions for successive iterations; and
programming code for, upon determining that the moved data point is oscillating between positions for successive iterations, identifying a new target segment that has the next largest linear interpolation error.

94. The system of claim 93, wherein programming code for determining whether the moved data point is oscillating between positions includes:
programming code for recording the moved data point, the direction of motion for the moved data point, and the resulting interpolation error for the target segment ($ES_{TARGET}$);
programming code for determining whether the moved data points are the same point for successive iterations;
programming code for, upon determining that the moved data points are the same point for successive iterations, determining whether the last two movements of the same data point are in opposite directions; and programming code for, upon determining that the last two movements of the same data point are in opposite directions,
    declaring that the moved data point is oscillating between positions, and
    selecting the data point position that results in the smallest sum of a first $ES_{TARGET}$ for a first $S_{TARGET}$ and a second $ES_{TARGET}$ for a second $S_{TARGET}$ that is adjacent to the first $S_{TARGET}$ and follows the first $S_{TARGET}$ in a successive iteration.

95. The system of claim 91, wherein moving $P_{S+1}$ includes decrementing $P_{S+1}$ along the series of source data sample points by at least one sample point, and moving $P_S$ includes incrementing $P_S$ along the series of source data sample points by at least one sample point.

96. The system of claim 91, wherein moving $P_{S+1}$ includes moving an X value for $P_{S+1}$ ($X(P_{S+1})$) by a predetermined $\Delta X$ and moving $P_S$ includes moving an X value for $P_S$ ($X(P_S)$) by the predetermined $\Delta X$.

97. The system of claim 91, wherein moving $P_{S+1}$ includes moving a Y value for $P_{S+1}$ ($Y(P_{S+1})$) by a predetermined $\Delta Y$ and moving $P_S$ includes moving a Y value for $P_S$ ($Y(P_S)$) by the predetermined $\Delta Y$.

98. A cell characterization system, comprising:
a processor;
computer readable medium coupled to the processor, wherein the computer readable medium is encoded with a computer program that causes the processor to extract best fit data points from a cell characterization source data for modeling of a cell using linear interpolation, the source data including a series of sample data points, wherein the computer readable medium includes:
    programming code for seeding a series of N data points on the characterization source data;
    programming code for performing an iterative process to identify best fit data points, including:
        programming code for determining linear interpolation errors between the N data points and the source data for M segments that are capable of being formed between adjacent data points, wherein M equals N−1;
        programming code for sorting the M segments based on linear interpolation error size;
        programming code for identifying a segment from the M segments with a largest interpolation error and identifying the segment with the largest interpolation error as a target segment ($S_{TARGET}$); and
        programming code for reducing the linear interpolation error for $S_{TARGET}$, including:
            programming code for determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
            programming code for determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);
            programming code for, upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;
            programming code for, upon determining that $ES_{1ST}$ is larger than $ES_{2ND}$, moving $P_{S+1}$ by an increment corresponding to at least one sample data point in the series of sample data points to shorten $S_{TARGET}$ and lengthen $S_{2ND}$; and
            programming code for, upon determining that $ES_{2ND}$ is larger than $ES_{1ST}$, moving $P_S$ by an increment corresponding to at least one sample data point in the series of sample data points to shorten $S_{TARGET}$ and lengthen $S_{1ST}$;
    programming code for extracting the best fit data points upon completion of the iterative process; and
    programming code for incorporating the best fit data points as the data subset for a simulation model table.

99. The system of claim 98, wherein the programming code for determining a linear interpolation error for each of the M segments includes programming code for quantifying a distance between the segment and the data source.

100. A cell characterization system, comprising:
a processor;
computer readable medium coupled to the processor, including:
    a first memory storage for storing cell characterization source data that includes a series of sample data points;
    a second memory storage for storing a data subset for a simulation model table; and
    a third memory storage for storing a computer program that causes the processor to extract best fit data points from a cell characterization source data for modeling of a cell using linear interpolation, wherein the third memory storage includes:
        programming code for seeding a series of N data points on the cell characterization source data;
        programming code for identifying M segments having endpoints defined by adjacent data points, wherein M equals N−1;
        programming code for determining a linear interpolation error for each of the M segments;
        programming code for identifying a segment from the M segments with a largest interpolation error and selecting the segment with the largest interpolation error as a target segment ($S_{TARGET}$); and
        programming code for reducing the interpolation error for $S_{TARGET}$ by moving one endpoint of $S_{TARGET}$ by an increment corresponding to at least one sample data point in the series of sample data points to shorten $S_{TARGET}$.

101. The system of claim 100, wherein the programming code for determining a linear interpolation error for each of the M segments includes programming code for quantifying a distance between the segment and the data source.

102. The method of claim 100, wherein the programming code for reducing the interpolation error for $S_{TARGET}$ includes:
    programming code for determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
    programming code for determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);
    programming code for, upon determining that there is no $S_{1ST}$, moving $P_{S+1}$ by an increment corresponding to at least one sample data point in the series of sample data points to shorten $S_{TARGET}$ and lengthen $S_{2ND}$; and
    programming code for, upon determining that there is no $S_{2ND}$, moving $P_S$ by an increment corresponding to at least one sample data point in the series of sample data points to shorten $S_{TARGET}$ and lengthen $S_{1ST}$.

103. A cell characterization system, comprising:
a processor;
computer readable medium coupled to the processor, including:
a first memory storage for storing cell characterization source data that includes a series of sample data points;
a second memory storage for storing a data subset for a simulation model table; and
a third memory storage for storing a computer program that causes the processor to extract best fit data points from a cell characterization data source for modeling of a cell using linear interpolation, wherein the memory storage includes:
programming code for seeding a series of N data points on the characterization source data;
programming code for performing an iterative process to identify best fit data points, including:
programming code for determining linear interpolation errors between the N data points and the source data for M segments that are capable of being formed between adjacent data points, wherein M equals N−1;
programming code for sorting the M segments based on linear interpolation error size;
programming code for identifying a segment from the M segments with a largest interpolation error and identifying the segment with the largest interpolation error as a target segment ($S_{TARGET}$); and
programming code for reducing the linear interpolation error for $S_{TARGET}$, including:
programming code for determining whether there is a first adjacent segment ($S_{1ST}$) having a common endpoint with $S_{TARGET}$ such that $S_{1ST}$ has endpoints defined by a first data point ($P_{S-1}$) and a second data point ($P_S$);
programming code for determining whether there is a second adjacent segment ($S_{2ND}$) having a common endpoint with $S_{TARGET}$ such that $S_{2ND}$ has endpoints defined by a first data point ($P_{S+1}$) and a second data point ($P_{S+2}$);
programming code for, upon determining that there is a $S_{1ST}$ and a $S_{2ND}$, determining whether an interpolation error for $S_{1ST}$ ($ES_{1ST}$) or an interpolation error for $S_{2ND}$ ($ES_{2ND}$) is larger;
programming code for, upon determining that $ES_{1ST}$ is larger than $ES_{2ND}$, moving $P_{S+1}$ by an increment corresponding to at least one sample data point in the series of sample data points to shorten $S_{TARGET}$ and lengthen $S_{2ND}$; and
programming code for, upon determining that $ES_{2ND}$ is larger than $ES_{1ST}$, moving $P_S$ by an increment corresponding to at least one sample data point in the series of sample data points to shorten $S_{TARGET}$ and lengthen $S_{1ST}$;
programming code for extracting the best fit data points upon completion of the iterative process; and
programming code for incorporating the best fit data points as the data subset for the simulation model table.

104. The system of claim 103, wherein the programming code for determining a linear interpolation error for each of the M segments includes programming code for quantifying a distance between the segment and the data source.

* * * * *

UNITED STATES PATENT AND TRADEMARK OFFICE
CERTIFICATE OF CORRECTION

PATENT NO. : 7,072,812 B2
APPLICATION NO. : 10/213214
DATED : July 4, 2006
INVENTOR(S) : Corr It is certified that error appears in the above-identified patent and that said Letters Patent is hereby corrected as shown below:

On the Title page, in Item (56), under "U.S. Patent Documents", in column 1, line 3, delete "708/14" and insert -- 703/14 --, therefor.

In column 3, line 1, delete "($P_{S+2}$)" and insert -- ($P_{S+2}$). --, therefor.

In column 3, line 46, delete "FIG. 2A-2H " and insert -- FIGS. 2A-2H --, therefor.

In column 3, line 63, after "points" insert -- . --.

In column 4, line 62, delete "or," and insert -- or --, therefor.

In column 5, line 34, delete "FIG. 2A-2H" and insert -- FIGS. 2A-2H --, therefor.

In column 11, line 54, delete "$P_{S+1}$," and insert -- $P_{S+1}$ --, therefor.

In column 19, line 32, in Claim 22, delete "AY" and insert -- $\Delta Y$ --, therefor.

In column 25, lines 13–14, in Claim 56, delete "TAR⁻GET" and insert -- TAR-GET --, therefor.

In column 26, lines 40–41, in Claim 63, delete "TAR⁻GET" and insert -- TAR-GET --, therefor.

In column 31, line 39, in Claim 79, delete "in to" and insert -- into --, therefor.

In column 32, line 12, in Claim 82, delete "($S_{1ST}$)" and insert -- ($ES_{1ST}$) --, therefor.

In column 32, line 24, in Claim 82, delete "in to" and insert -- into --, therefor.

In column 34, lines 7–8, in Claim 91, delete "TAR⁻GET" and insert -- TAR-GET --, therefor.

In column 34, line 18, in Claim 91, delete "($P_{S-1}$)" and insert -- ($P_{S+1}$) --, therefor.

In column 34, line 39, in Claim 92, delete "$S_{2ND}$," and insert -- $S_{2ND}$; --, therefor.

UNITED STATES PATENT AND TRADEMARK OFFICE
CERTIFICATE OF CORRECTION

PATENT NO.      : 7,072,812 B2
APPLICATION NO. : 10/213214
DATED           : July 4, 2006
INVENTOR(S)     : Corr It is certified that error appears in the above-identified patent and that said Letters Patent is hereby corrected as shown below:

In column 37, line 14, in Claim 103, after "the" insert -- third --.

Signed and Sealed this

Twentieth Day of February, 2007

JON W. DUDAS
*Director of the United States Patent and Trademark Office*